(12) United States Patent
Emura

(10) Patent No.: US 10,553,770 B2
(45) Date of Patent: Feb. 4, 2020

(54) LIGHT EMITTING DEVICE INCLUDING LIGHT EMITTING ELEMENT WITH MULTIPLE LIGHT EMITTING CELLS

(71) Applicant: NICHIA CORPORATION, Anan-shi, Tokushima (JP)

(72) Inventor: Keiji Emura, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/945,172

(22) Filed: Apr. 4, 2018

(65) Prior Publication Data

US 2018/0294391 A1 Oct. 11, 2018

(30) Foreign Application Priority Data

Apr. 5, 2017 (JP) .................................. 2017-075482

(51) Int. Cl.
*H01L 33/62* (2010.01)
*H01L 33/64* (2010.01)
*H01L 33/60* (2010.01)
*H01L 25/075* (2006.01)
*H01L 27/15* (2006.01)

(52) U.S. Cl.
CPC .......... *H01L 33/62* (2013.01); *H01L 25/0753* (2013.01); *H01L 27/156* (2013.01); *H01L 33/60* (2013.01); *H01L 33/647* (2013.01)

(58) Field of Classification Search
CPC ...... H01L 33/62; H01L 27/156; H01L 27/153
See application file for complete search history.

(56) References Cited

U.S. PATENT DOCUMENTS

| | | |
|---|---|---|
| 2008/0210954 A1 | 9/2008 | Lee et al. |
| 2008/0211416 A1 | 9/2008 | Negley et al. |
| 2009/0267085 A1 | 10/2009 | Lee et al. |
| 2010/0019253 A1 | 1/2010 | Kim et al. |

(Continued)

FOREIGN PATENT DOCUMENTS

| | | |
|---|---|---|
| JP | 2009-505393 A | 2/2009 |
| JP | 2010-517274 A | 5/2010 |

(Continued)

*Primary Examiner* — Thao X Le
*Assistant Examiner* — Laura M Dykes
(74) *Attorney, Agent, or Firm* — Foley & Lardner LLP

(57) ABSTRACT

A light emitting device includes a light emitting element and a mounting substrate on which the light emitting element is mounted such that the mounting substrate faces an upper side of the light emitting element. The light emitting element includes a substrate, first and second light emitting cells each including a semiconductor layered structure that includes an n-side semiconductor layer and a p-side semiconductor layer in order from a substrate side, a first insulating layer, wiring electrodes, and a second insulating layer. One of the wiring electrodes is electrically connected to the n-side semiconductor layer of the first light emitting cell and to the p-side semiconductor layer of the second light emitting cell. The mounting substrate includes wiring terminals, one of which is electrically connected to the n-side semiconductor layer of the first light emitting cell and to the p-side semiconductor layer of the second light emitting cell.

22 Claims, 24 Drawing Sheets

(56) References Cited

U.S. PATENT DOCUMENTS

| | | | | |
|---|---|---|---|---|
| 2012/0074441 A1* | 3/2012 | Seo | .................... | H01L 27/153 |
| | | | | 257/91 |
| 2013/0264592 A1* | 10/2013 | Bergmann | .............. | H01L 33/50 |
| | | | | 257/88 |
| 2016/0064611 A1* | 3/2016 | Choi | .................... | H01L 33/382 |
| | | | | 257/98 |

FOREIGN PATENT DOCUMENTS

| | | | |
|---|---|---|---|
| JP | 2010-521807 A | 6/2010 | |
| JP | 2011-066463 A | 3/2011 | |
| JP | 2016-012707 A | 1/2016 | |

\* cited by examiner

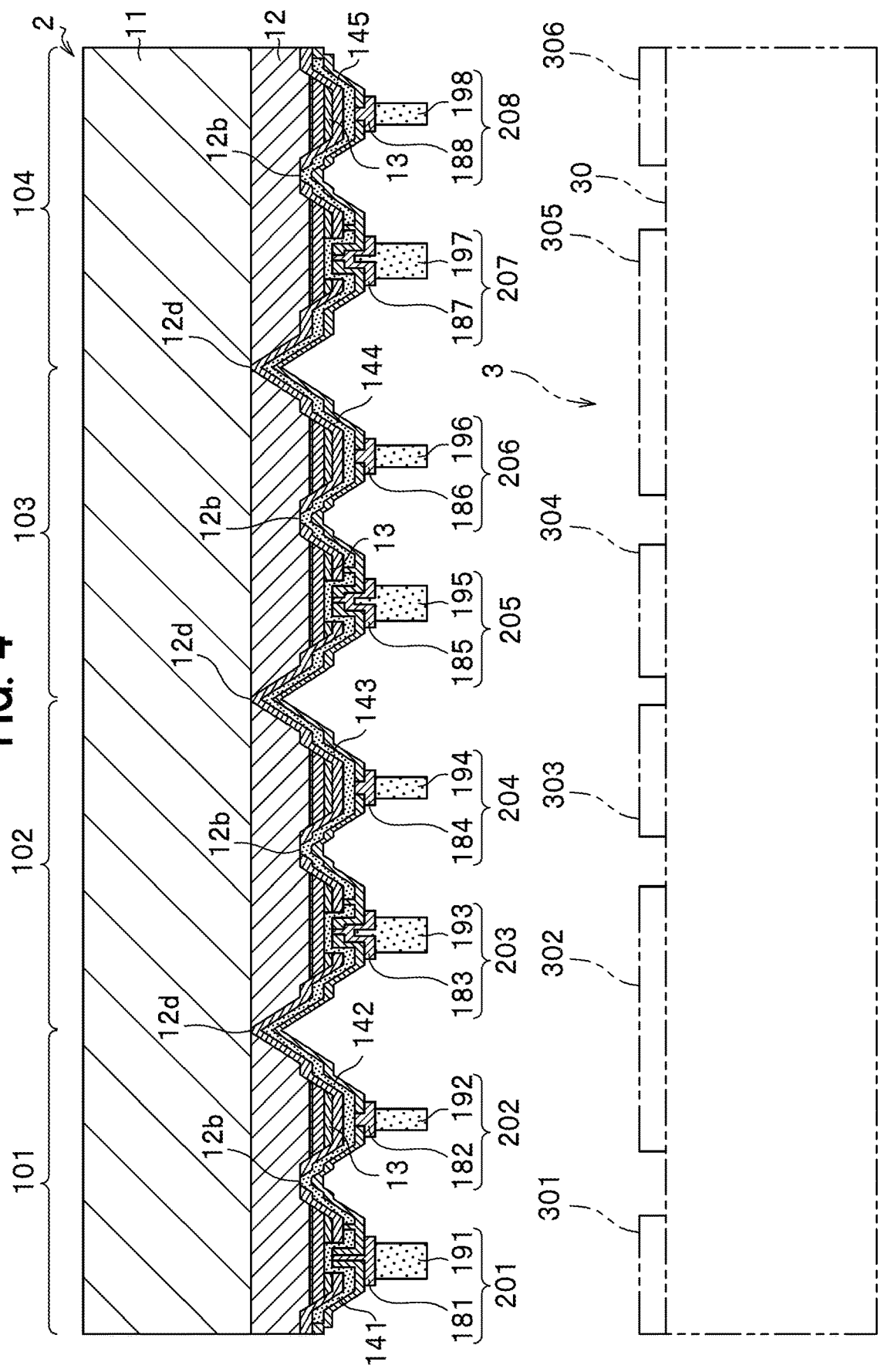

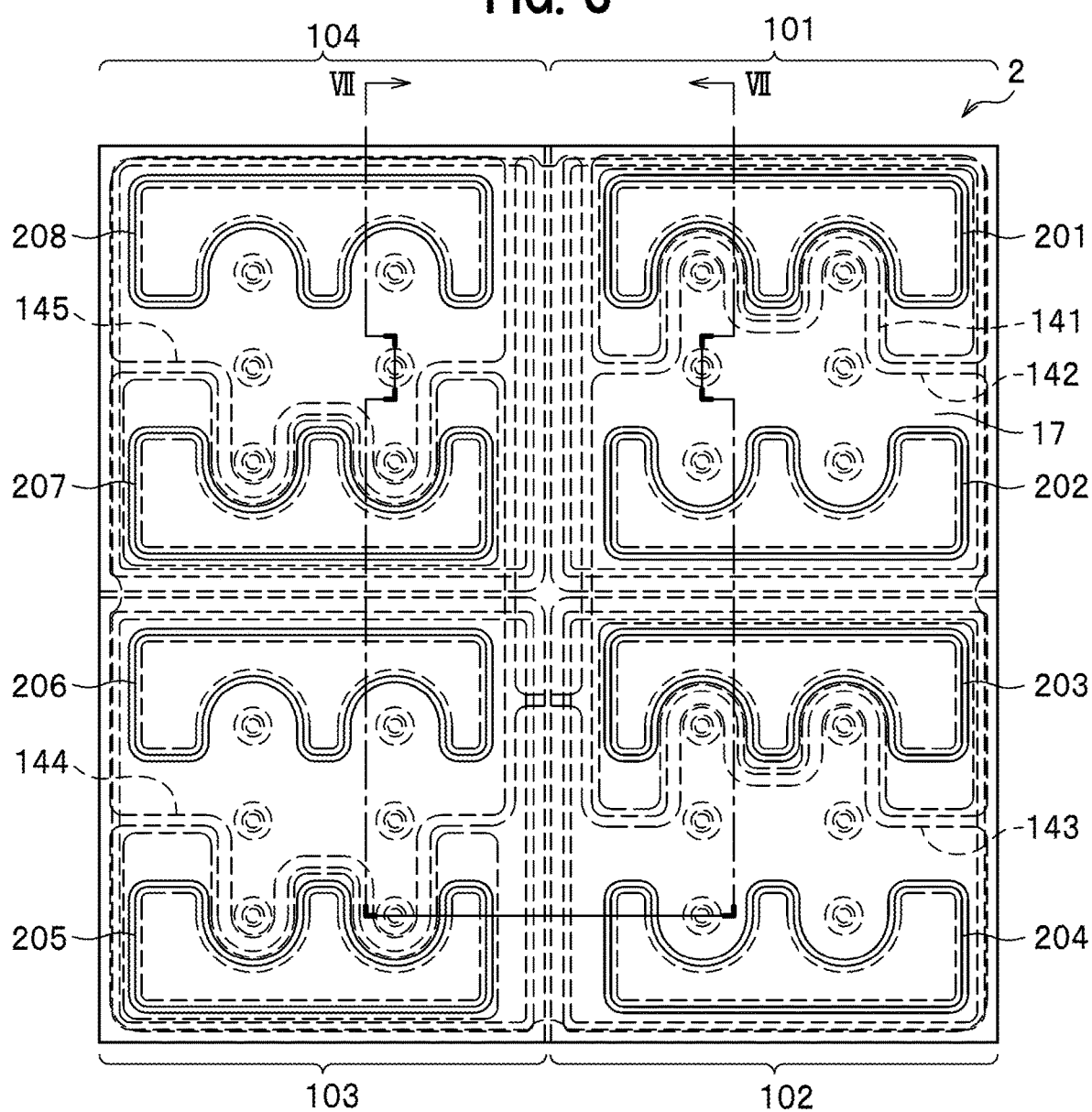

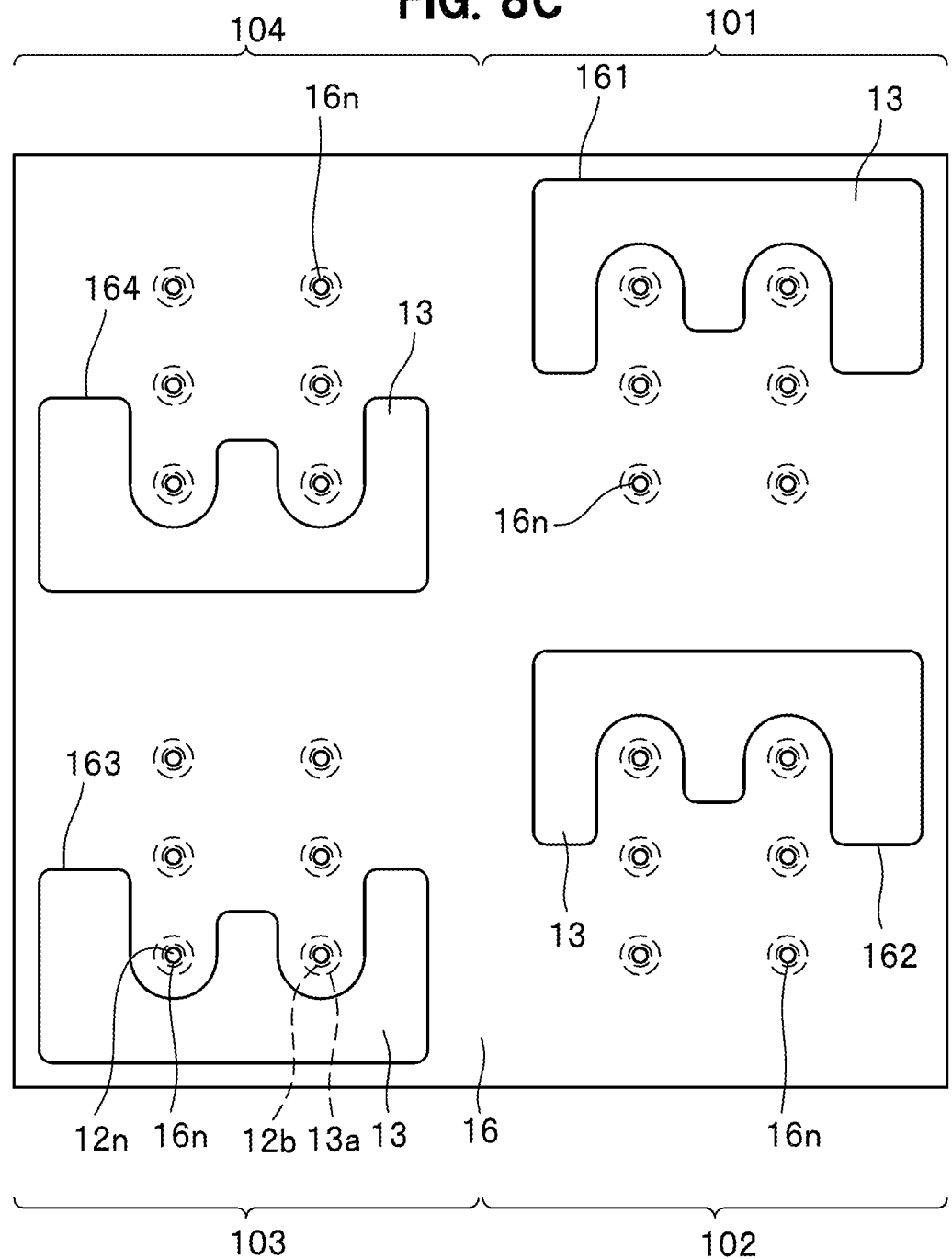

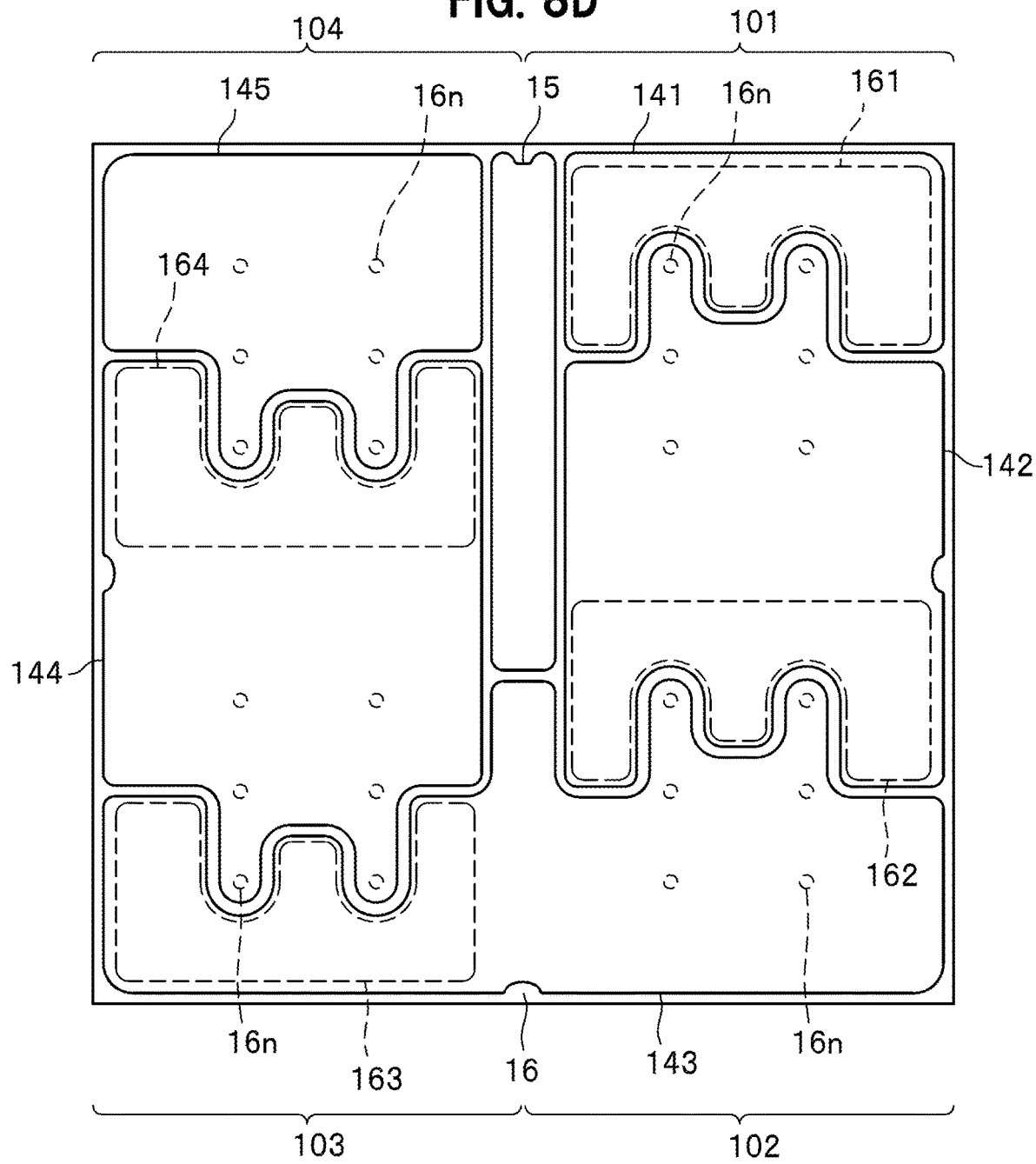

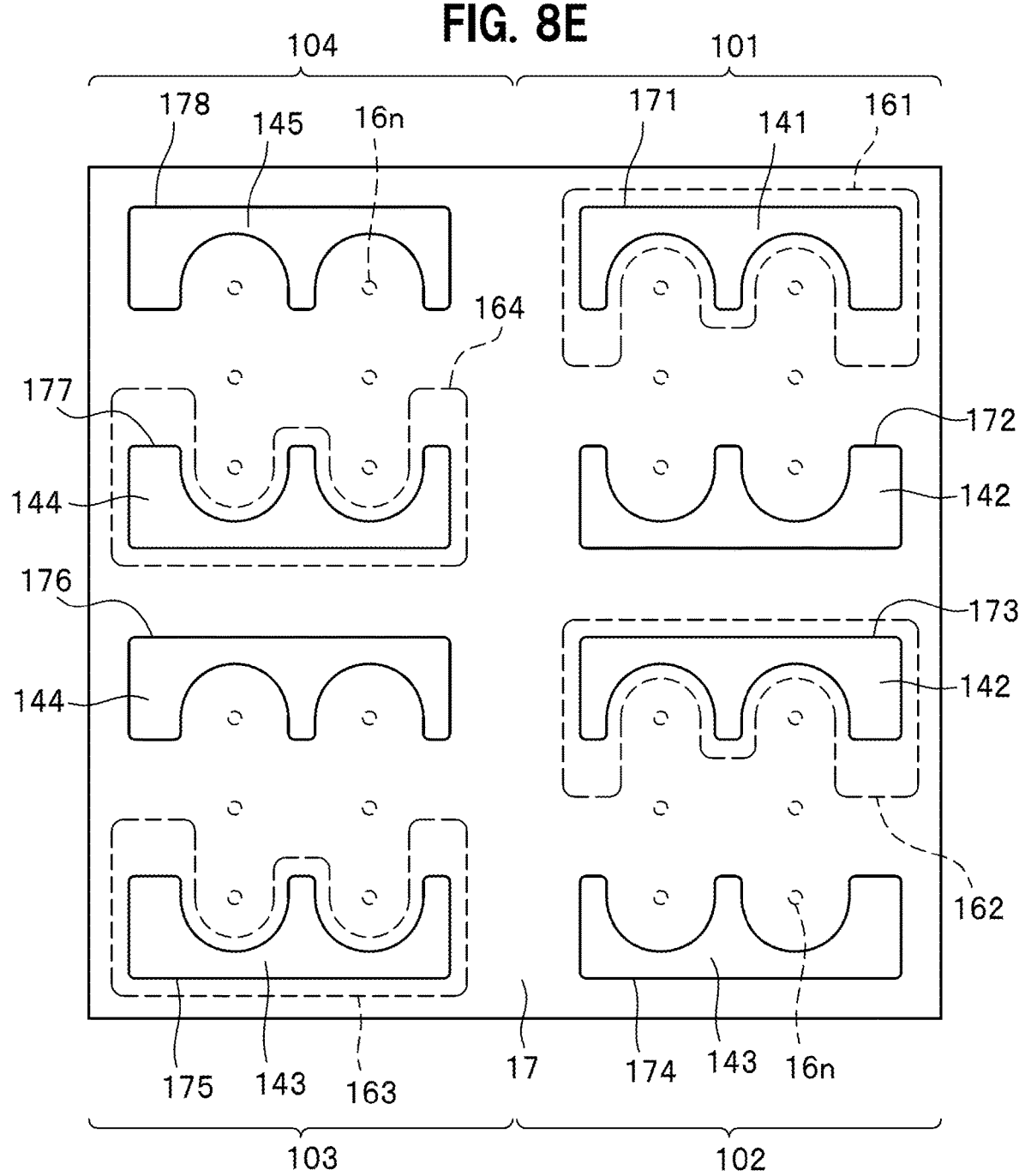

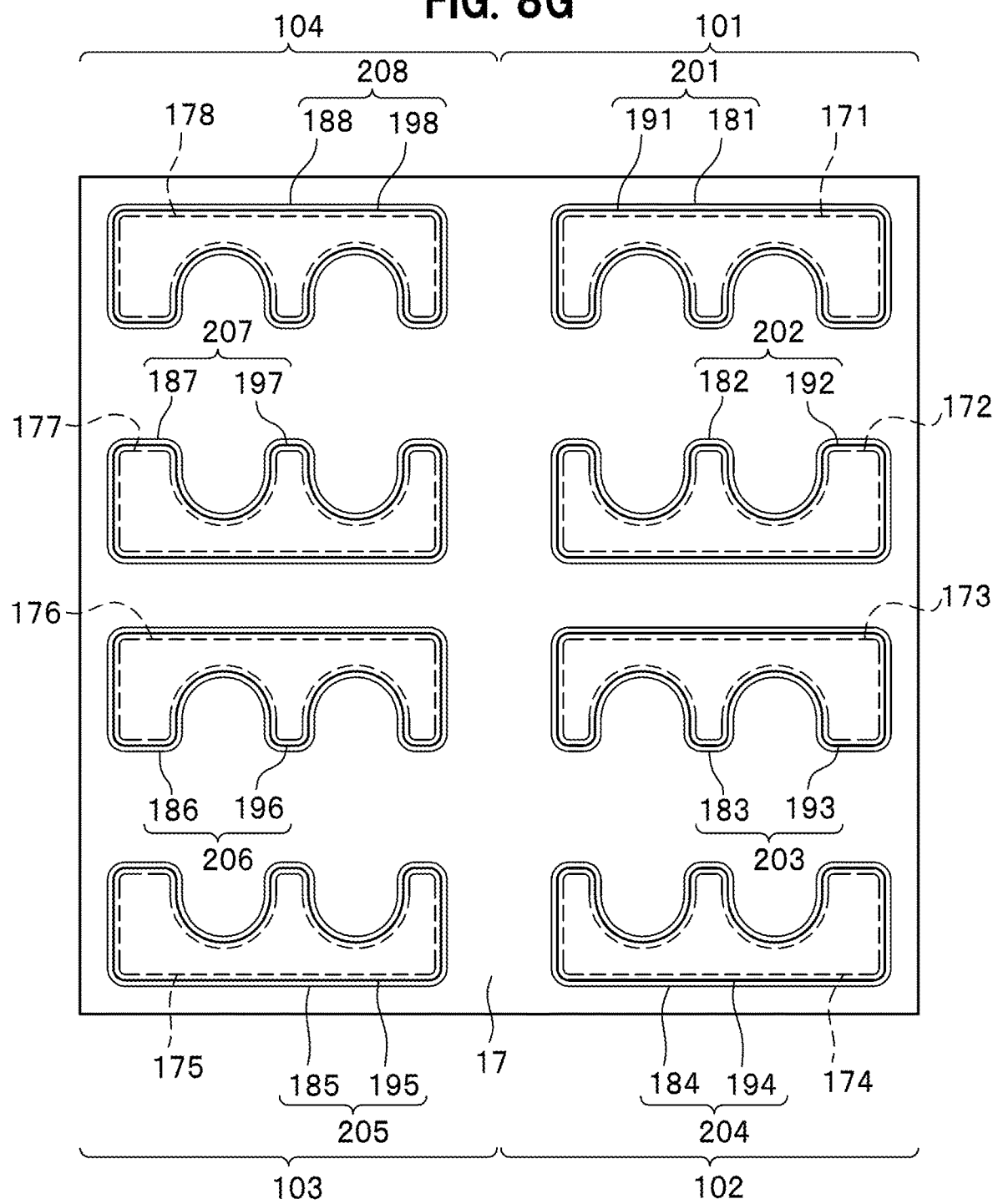

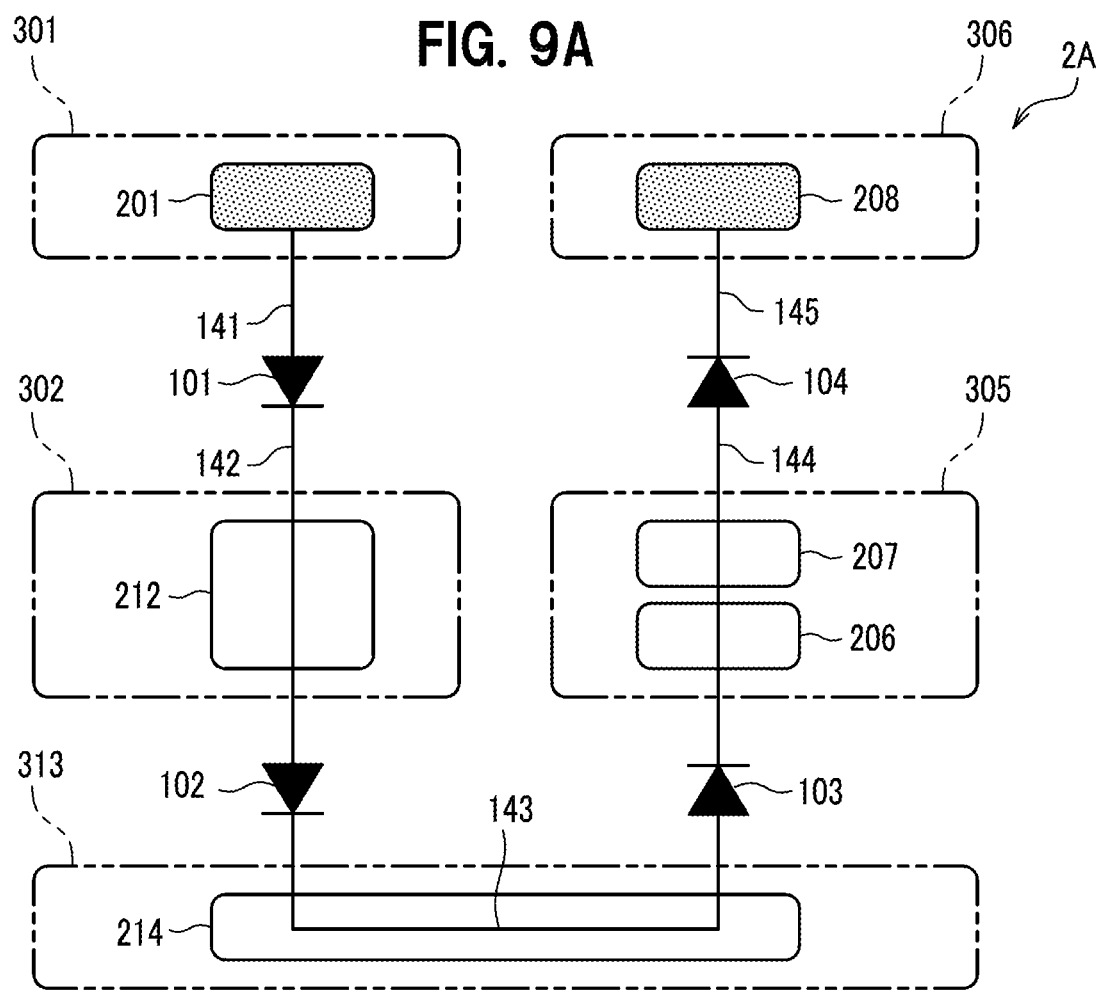
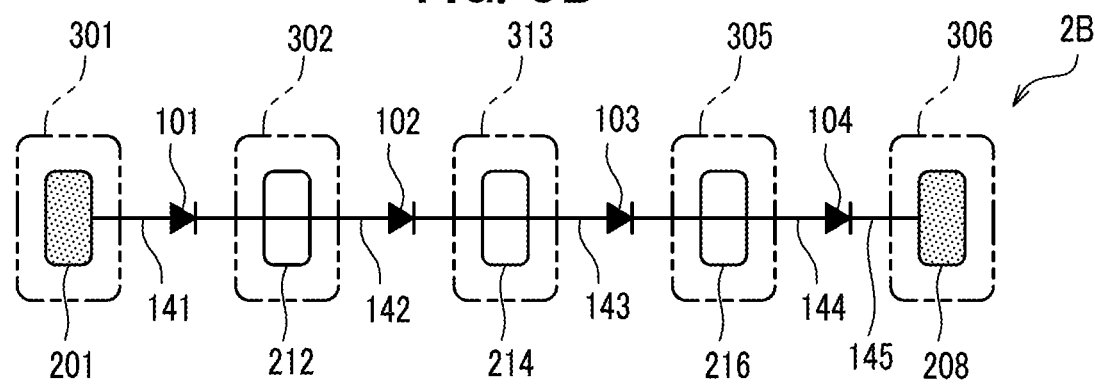
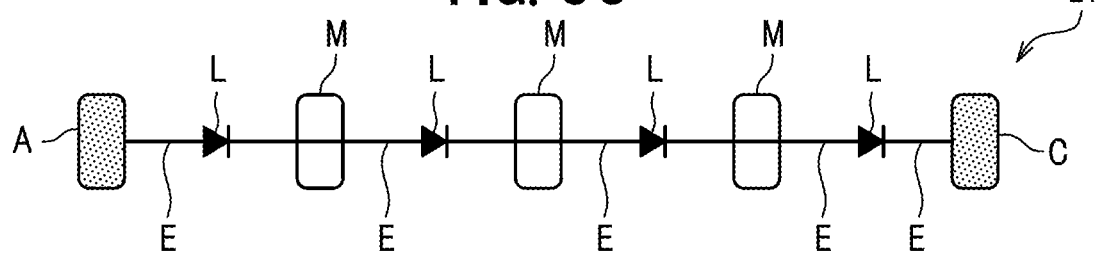

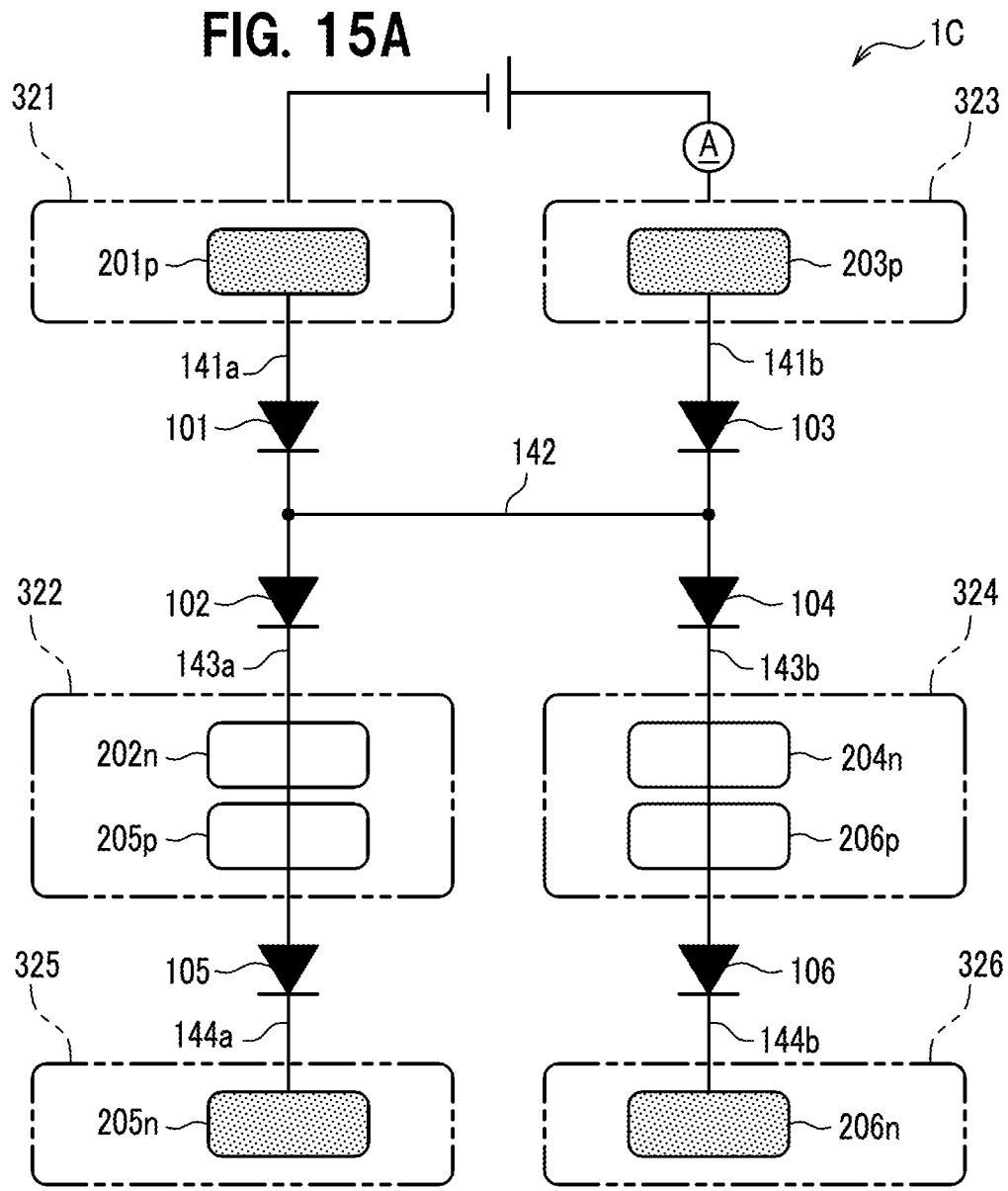

LIGHT EMITTING DEVICE INCLUDING LIGHT EMITTING ELEMENT WITH MULTIPLE LIGHT EMITTING CELLS

CROSS-REFERENCE TO RELATED PATENT APPLICATION

This application claims priority to Japanese Patent Application No. 2017-075482 filed on Apr. 5, 2017. The entire disclosure of Japanese Patent Application No. 2017-075482 is hereby incorporated herein by reference.

BACKGROUND

The present disclosure relates to a light emitting device.

There has been known a light emitting device that includes a mounting substrate and a light emitting element including a plurality of light emitting cells (see, for example, JP 2016-012707 A). The mounting substrate includes a plurality of wiring terminals for a power source that are to be connected to an external power source. The light emitting element includes a plurality of bonding members, each of which is connected to a respective one of the plurality of wiring terminals for a power source. Further, in the light emitting element, the plurality of light emitting cells are arranged on a substrate, and are electrically connected in series by wiring electrodes.

SUMMARY

In a known light emitting device such as described in JP 2016-012707A, wiring terminals for a power source are disposed spaced apart from each other on the mounting substrate such that each of the wiring terminals for a power source extends over a plurality of light emitting cells that are electrically connected in series by wiring electrodes disposed on the light emitting cells when viewed from above. With this arrangement, a potential difference between the wiring terminals for a power source and the light emitting cells or the wiring electrodes on the light emitting cells tends to be increased. This may lead to migration of metal ions from the bonding member if a crack occurs in a protective film provided on the light emitting cells, by which metal ions from the bonding member move through the crack in the protective layer to the light emitting cell and/or the wiring electrode provided on the light emitting cell. Such migration may cause a leak current, which may lead to a reduction in reliability of the light emitting device.

Further, the plurality of light emitting cells are connected in series only by the wiring electrodes. In such a configuration, if disconnection of the wiring electrodes occurs, the conduction path may not be maintained, which may lead to non-lighting of all of the light emitting cells.

Certain embodiments described herein have been developed in the light of such circumstances, and it is hence on object of the present disclosure to provide a light emitting device with increased reliability.

A light emitting device according to one embodiment of the present invention includes: a light emitting element including: a substrate, a first light emitting cell and a second light emitting cell, each of the first and second light emitting cell comprising a semiconductor layered structure that includes an n-side semiconductor layer and a p-side semiconductor layer in order from a substrate side, a first insulating layer covering an upper side of each of the first light emitting cell and the second light emitting cell and defining first n-side openings and a first p-side opening above each of the first and second light emitting cells, a plurality of wiring electrodes covering an upper side of the first insulating layer and including: a first wiring electrode electrically connected to the p-side semiconductor layer of the first light emitting cell via the first p-side opening above the first light emitting cell, a second wiring electrode electrically connected to the n-side semiconductor layer of the first light emitting cell via the first n-side openings above the first light emitting cell and electrically connected to the p-side semiconductor layer of the second light emitting cell via the first p-side opening above the second light emitting cell, and a third wiring electrode electrically connected to the n-side semiconductor layer of the second light emitting cell via the first n-side openings above the second light emitting cell, a second insulating layer covering an upper side of the plurality of wiring electrodes and defining second n-side openings and a second p-side opening above each of the first and second light emitting cells, a first bonding member disposed at the second p-side opening of the first light emitting cell, a second bonding member disposed at the second n-side opening of the first light emitting cell, a third bonding member disposed at the second p-side opening of the second light emitting cell, and a fourth bonding member disposed at the second n-side opening of the second light emitting cell; and a mounting substrate on which the light emitting element is mounted such that the mounting substrate faces an upper side of the light emitting element, the mounting substrate including: a first wiring terminal electrically connected to the p-side semiconductor layer of the first light emitting cell via the first bonding member at the second p-side opening corresponding to the first light emitting cell, a second wiring terminal electrically connected to the n-side semiconductor layer of the first light emitting cell via the second bonding member at the second n-side opening corresponding to the first light emitting cell and electrically connected to the p-side semiconductor layer of the second light emitting cell via the third bonding member at the second p-side opening corresponding to the second light emitting cell, and a third wiring terminal electrically connected to the n-side semiconductor layer of the second light emitting cell via the fourth bonding member at the second n-side opening corresponding to the second light emitting cell.

Further, light emitting device according to another embodiment of the present invention includes: a light emitting element including: a substrate, a first light emitting cell, a second light emitting cell, a third light emitting cell, a fourth light emitting cell, a fifth light emitting cell, and a sixth light emitting cell, each of the first to sixth light emitting cells including a semiconductor layered structure that includes an n-side semiconductor layer and a p-side semiconductor layer in order from a substrate side, a first insulating layer covering an upper side of each of the first to sixth light emitting cells and defining first n-side openings and a first p-side opening above each of the first to sixth light emitting cells, a plurality of wiring electrodes covering an upper side of the first insulating layer and including: a first wiring electrode electrically connected to the p-side semiconductor layer of the first light emitting cell via the first p-side opening above the first light emitting cell, a second wiring electrode electrically connected to the p-side semiconductor layer of the third light emitting cell via the first p-side opening above the third light emitting cell, a third wiring electrode electrically connected to the n-side semiconductor layer of the first light emitting cell via the first n-side openings above the first light emitting cell, electrically connected to the p-side semiconductor layer of the second light emitting cell via the first p-side opening above the second light emitting cell, electrically connected to the n-side semiconductor layer of the third light emitting cell via the first n-side openings above the third light emitting cell, and electrically connected to the p-side semiconductor layer of the fourth light emitting cell via the first p-side opening above the fourth light emitting cell, a fourth wiring electrode electrically connected to the n-side semiconductor layer of the second light emitting cell via the first n-side openings above the second light emitting cell and electrically connected to the p-side semiconductor layer of the fifth light emitting cell via the first p-side opening above the fifth light emitting cell, a fifth wiring electrode electrically connected to the n-side semiconductor layer of the fourth light emitting cell via the first n-side openings above the fourth light emitting cell and electrically connected to the p-side semiconductor layer of the sixth light emitting cell via the first p-side opening above the sixth light emitting cell, a sixth wiring electrode electrically connected to the n-side semiconductor layer of the fifth light emitting cell via the first n-side openings above the fifth light emitting cell, and a seventh wiring electrode electrically connected to the n-side semiconductor layer of the sixth light emitting cell via the first n-side openings above the sixth light emitting cell, a second insulating layer covering an upper side of the plurality of wiring electrodes and defining second n-side openings and a second p-side opening above each of the first, third, fifth, and sixth light emitting cells, and a first bonding member disposed at the second p-side opening of the first light emitting cell, a second bonding member disposed at the second p-side opening of the third light emitting cell, a third bonding member disposed at the second n-side opening of the second light emitting cell, a fourth bonding member disposed at the second p-side opening of the fifth light emitting cell, a fifth bonding member disposed at the second n-side opening of the fourth light emitting cell, and a sixth bonding member disposed at the second n-side opening of the sixth light emitting cell; and a mounting substrate on which the light emitting element is mounted such that the mounting substrate faces an upper side of the light emitting element, the mounting substrate including: a first wiring terminal electrically connected to the p-side semiconductor layer of the first light emitting cell via the first bonding member at the second p-side opening corresponding to the first light emitting cell, a second wiring terminal electrically connected to the p-side semiconductor layer of the third light emitting cell via the second bonding member at the second p-side opening corresponding to the third light emitting cell, a third wiring terminal electrically connected to the n-side semiconductor layer of the second light emitting cell via the third bonding member at the second n-side opening corresponding to the second light emitting cell and electrically connected to the p-side semiconductor layer of the fifth light emitting cell via the fourth bonding member at the second p-side opening corresponding to the fifth light emitting cell, a fourth wiring terminal electrically connected to the n-side semiconductor layer of the fourth light emitting cell via the fifth bonding member at the second n-side opening corresponding to the fourth light emitting cell and electrically connected to the p-side semiconductor layer of the sixth light emitting cell via the sixth bonding member at the second p-side opening corresponding to the sixth light emitting cell, a fifth wiring terminal electrically connected to the sixth wiring electrode that is electrically connected to the n-side semiconductor layer of the fifth light emitting cell via the first n-side openings above the fifth light emitting cell, and a sixth wiring terminal electrically connected to the seventh wiring electrode that is electrically connected to the n-side semiconductor layer of the sixth light emitting cell via the first n-side openings above the sixth light emitting cell.

A light emitting device according to certain embodiments described herein can have an increased reliability.

BRIEF DESCRIPTION OF THE DRAWINGS

FIG. 4 is a schematic cross-sectional view of a light emitting device according to the first embodiment taken along a line IV-IV in FIG. 3.

FIG. 6 is a schematic plan view of the light emitting element according to the first embodiment showing a configuration of the electrodes.

FIG. 8C is a schematic plan view for explaining the layer structure of the light emitting element according to the first embodiment, in which an arrangement region of a first insulating layer is shown.

FIG. 8D is a schematic plan view of a layer structure of the light emitting element according to the first embodiment, in which arrangement regions of wiring electrodes and the light-reflective metal layers are shown.

FIG. 8E is a schematic plan view for explaining a layer structure of a light emitting element according to the first embodiment, in which an arrangement region of a second insulating layer is shown.

FIG. 8G is a schematic plan view for explaining the layer structure of the light emitting element according to the first embodiment, in which arrangement regions of conductive members disposed on the metal layers in FIG. 8F are shown.

FIG. 9A is a circuit diagram illustrating an equivalent circuit of a light emitting element according to a first variant example of the first embodiment.

FIG. 9B is a circuit diagram illustrating an equivalent circuit of the light emitting element according to a second variant example of the first embodiment.

FIG. 9C is a circuit diagram illustrating an equivalent circuit of the light emitting element according to the second variant example of the first embodiment, and is a simplified diagram of the circuit diagram in FIG. 9B.

FIG. 15A is a circuit diagram for illustrating a first measuring step in a method of inspecting a light emitting device according to the third embodiment.

DETAILED DESCRIPTION

Figure 1:
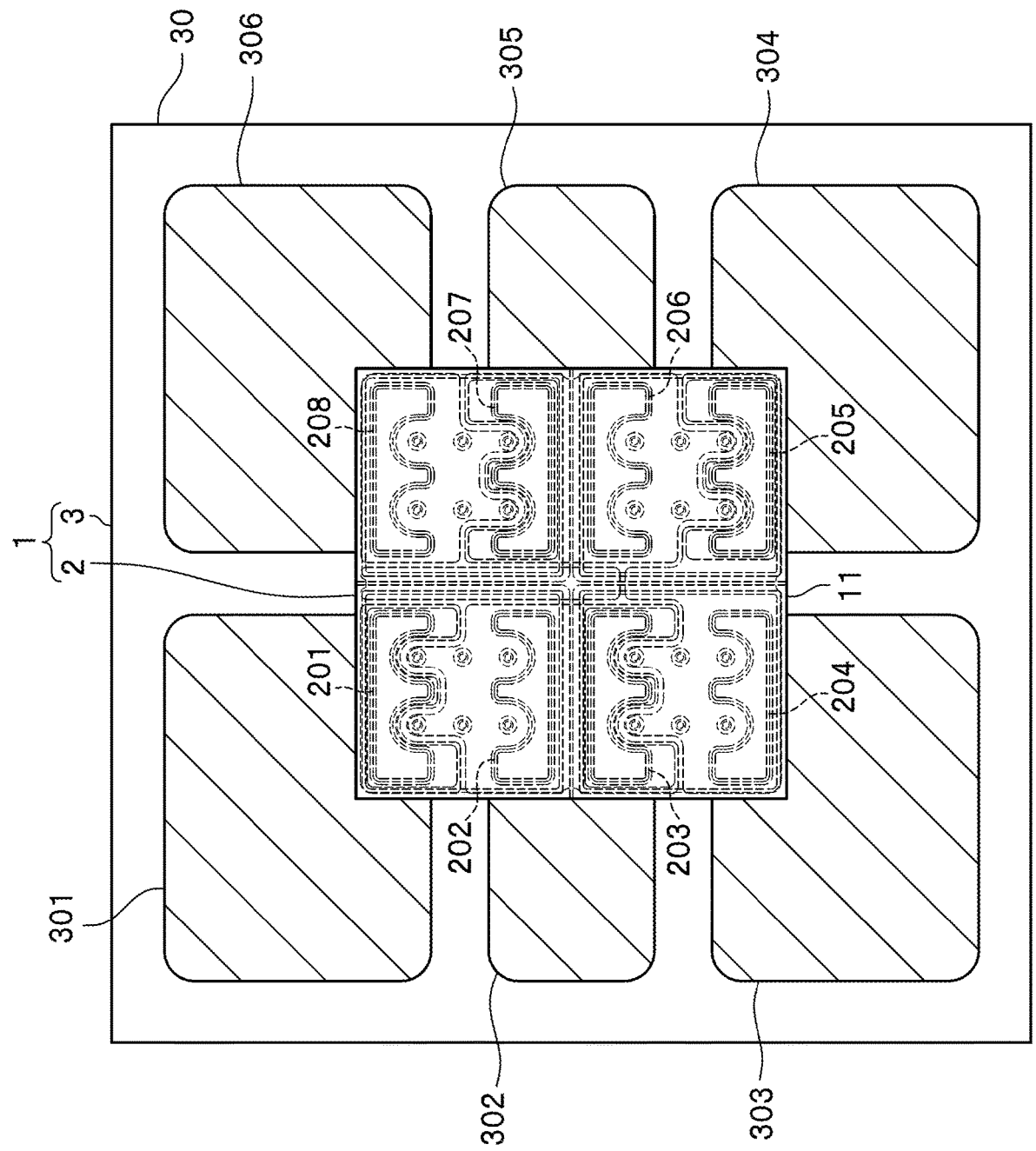
FIG. 1 is a schematic plan view of a light emitting device according to a first embodiment.

A light emitting device according to certain embodiments will be described below.

The drawings referred to in the description below are to schematically illustrate embodiments. The sizes, intervals, or locational relationships of the components may be exaggerated. Also, the size and/or space or interval of components may not be the same between a plan view and its corresponding cross-sectional view. In the description below, the same designations or the same reference numerals denote the same or like members and duplicative descriptions will be appropriately omitted.

In the present specification, the terms such as "upper" and "lower" are used to illustrate a relative locational relationship between the components in a drawing, and unless specifically indicated, are not intended to show absolute positional relationship.

First Embodiment

With reference to FIG. 1A to FIG. 8D, a structure of a light emitting device according to a first embodiment will be described below. The schematic cross-sectional view in FIG. 4 is taken along a IV-IV line, which is a polygonal line, in FIG. 3. Distances and intervals in FIG. 4 are appropriately increased or reduced from distances and intervals (i.e., size of components) in FIG. 3, and thus distances and intervals in FIG. 3 do not correspond to those in FIG. 4.

Figure 3:
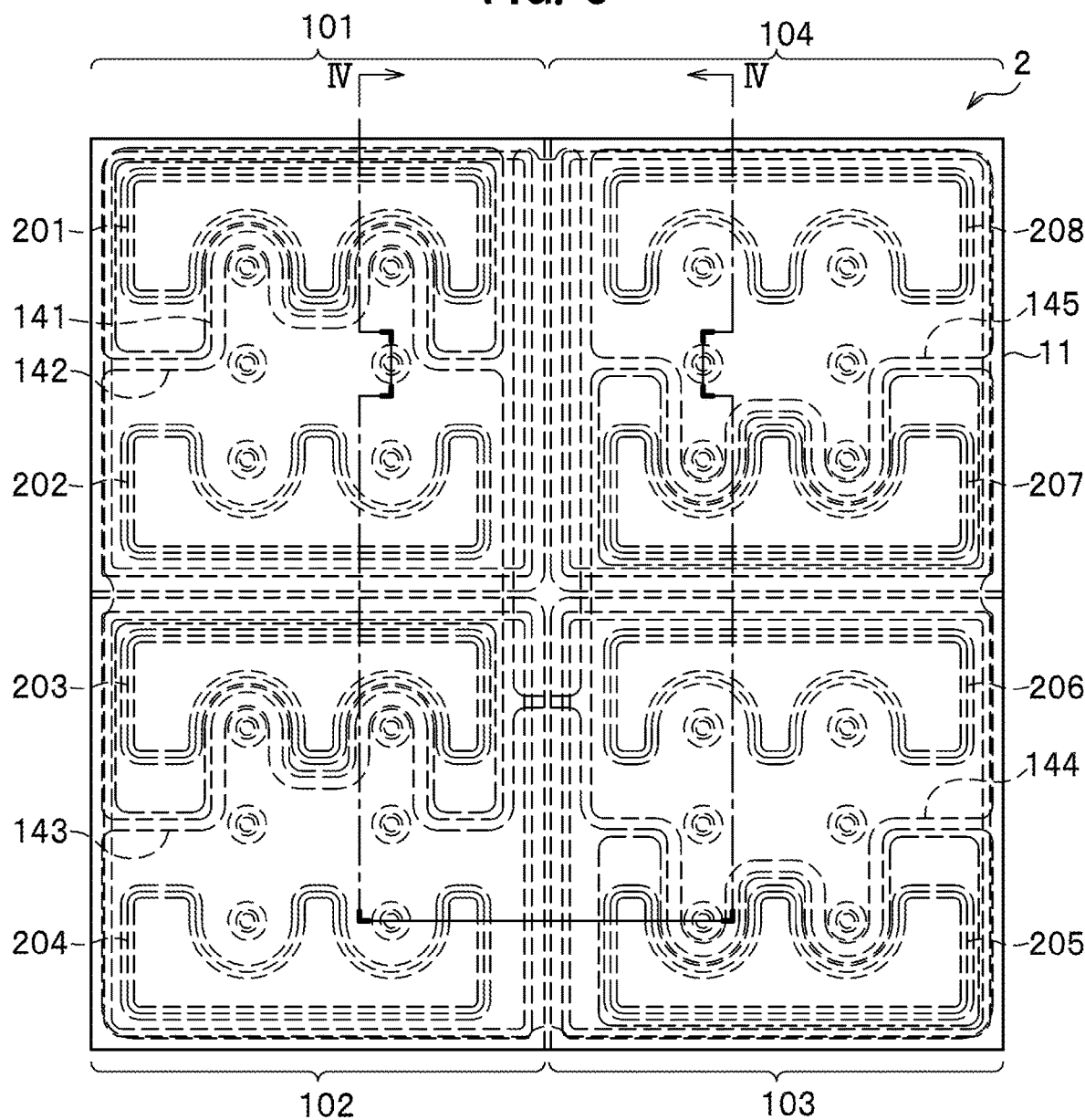
FIG. 3 is a schematic plan view of a light emitting element according to the first embodiment showing a surface of the light emitting element at a substrate side.
Figure 7:
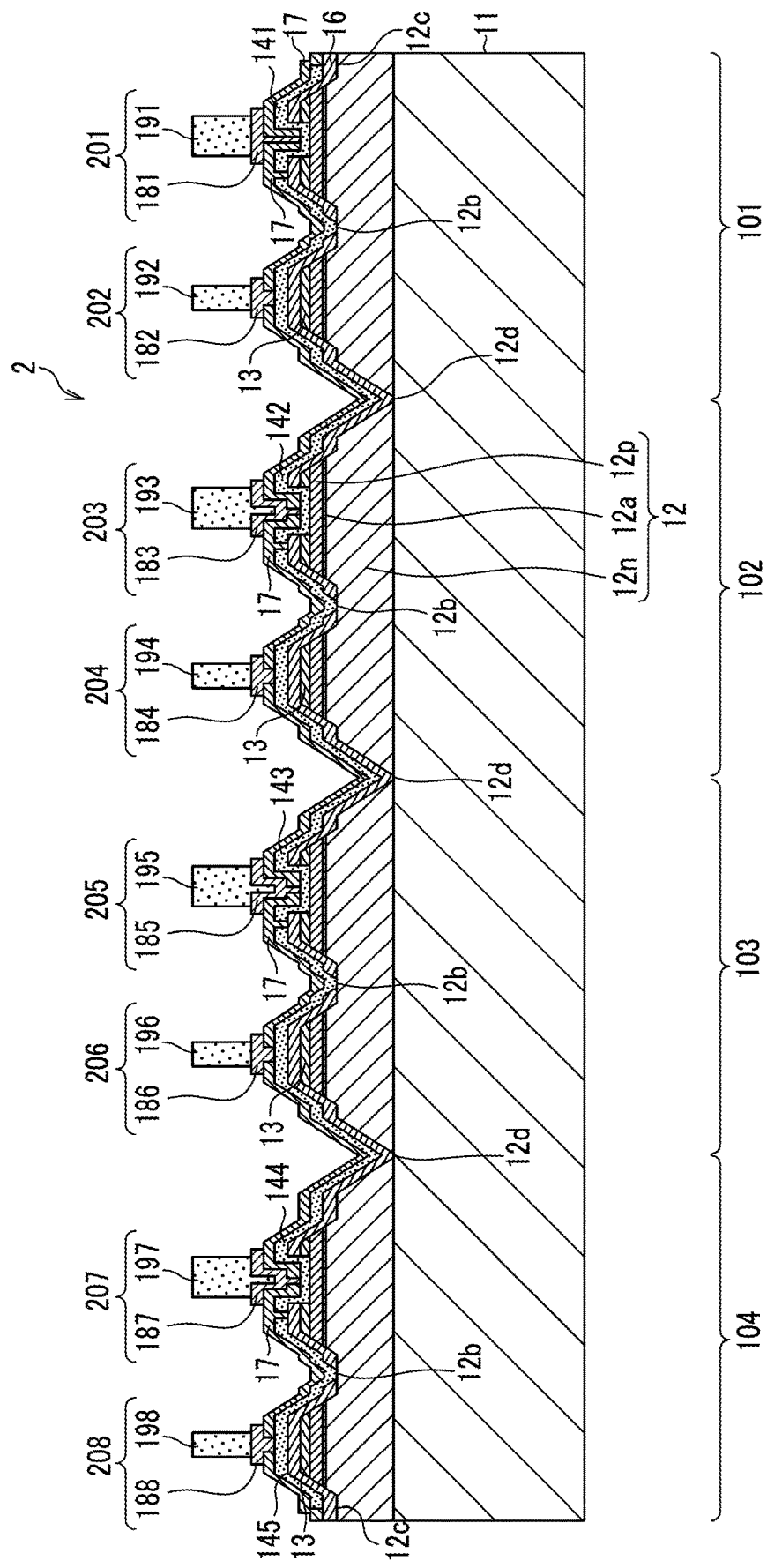
FIG. 7 is a schematic cross-sectional view of the light emitting element according to the first embodiment taken along a line VII-VII in FIG. 6.

FIG. 6 is a plan view viewed from a reverse side of a plan view in FIG. 3. The schematic cross-sectional view in FIG. 7 is taken along a VII-VII line, which is a polygonal line, in FIG. 6. FIG. 7 is a schematic cross-sectional view taken in a state where the light emitting element in FIG. 4 is rotated by 180° showing a cross section similar to that in FIG. 4.

In each of FIG. 8A to FIG. 8G components in the light emitting element that are sequentially layered from an upper surface side of a substrate 11 are shown in order to explain a layered structure of the light emitting element.

Figure 2:
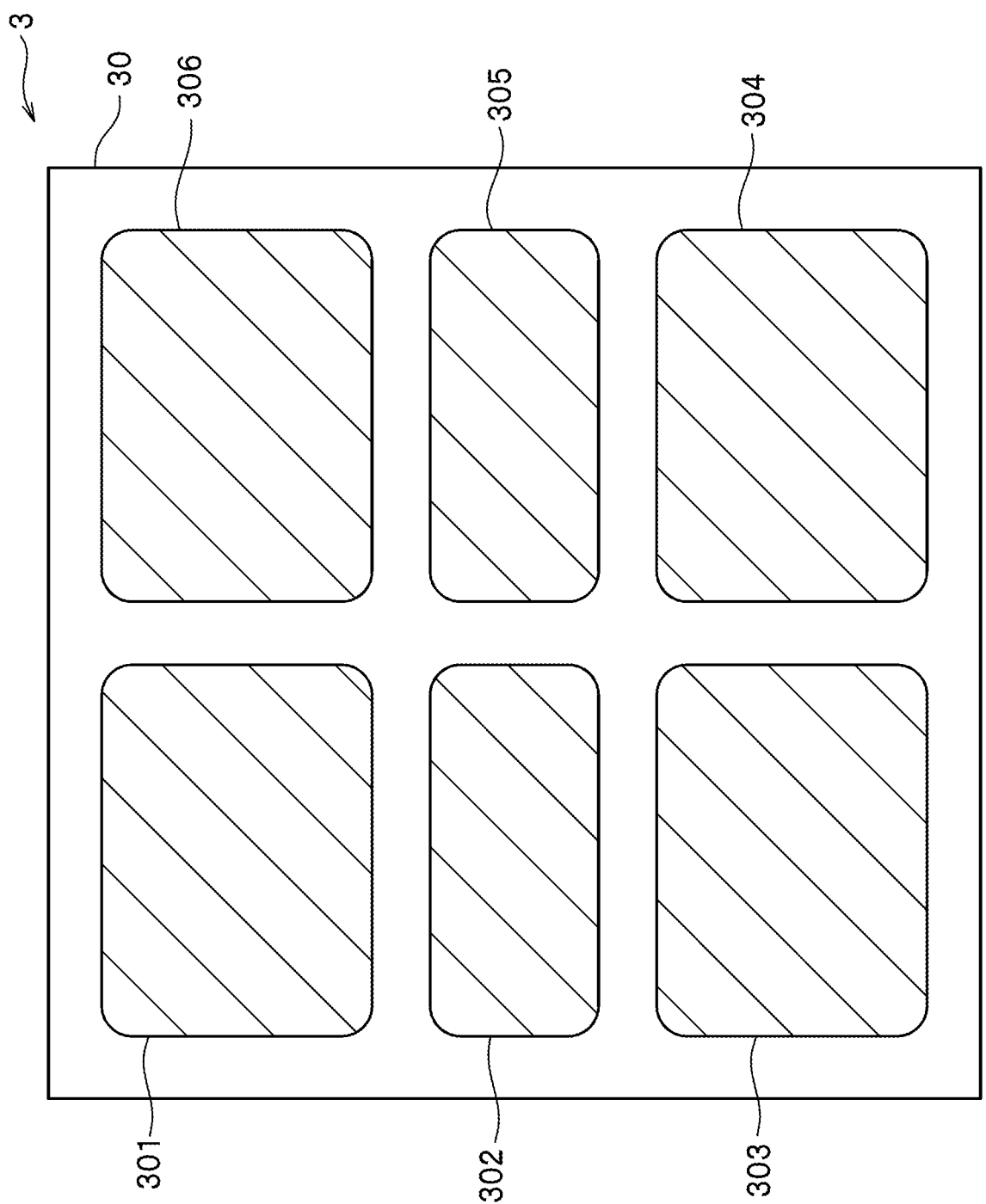
FIG. 2 is a schematic plan view of a mounting substrate according to the first embodiment.

As shown in FIG. 1 to FIG. 4, a light emitting device 1 includes a light emitting element 2, and a mounting substrate 3. As shown in FIG. 1 and FIG. 2, the mounting substrate 3 includes a plurality of wiring terminals 301 to 306 (first to sixth wiring terminals 301 to 306). As shown in FIG. 6 and FIG. 7, the light emitting element 2 includes the substrate 11, a plurality of light emitting cells 101 to 104 (first to fourth light emitting cells 101 to 104), a first insulating layer 16, a plurality of wiring electrodes 141 to 145 (first to fifth wiring electrodes 141 to 145), and a second insulating layer 17. As shown in FIG. 1, FIG. 3, and FIG. 4, the light emitting element 2 further includes a plurality of bonding members 201 to 208 (first to eighth bonding members 201 to 208). Each of the bonding members 201 to 208 (first to eighth bonding members 201 to 208) is connected to a corresponding one of the wiring terminals 301 to 306 (first to sixth wiring terminals 301 to 306) of the mounting substrate 3. Hereinafter, a substrate 11 side of the light emitting element 2 may be referred to as a "lower side of the light emitting element 2". As shown in FIG. 4, the light emitting element 2 is mounted on the mounting substrate 3 such that the mounting substrate 3 faces an upper side of the light emitting element 2.

As shown in FIG. 7, each of the light emitting cells 101 to 104 (first to fourth light emitting cells 101 to 104) is formed at an upper surface side of the substrate 11, and includes a semiconductor layered body 12 including an n-side semiconductor layer 12n and a p-side semiconductor layer 12p in order from the upper surface side of the substrate 11.

As shown in FIG. 8C, the first insulating layer 16 covers an upper side of each of the light emitting cells 101 to 104, and defines first n-side openings 16n and first p-side openings 161 to 164. Each of the first n-side openings 16n and each of the first p-side openings 161 to 164 are defined at an upper side of a respective one of the light emitting cells 101 to 104.

As shown in FIG. 8D, the plurality of wiring electrodes 141 to 145 (first to fifth wiring electrodes 141 to 145) electrically connects the light emitting cells 101 to 104 on the substrate 11 in series.

As shown in FIG. 8E, the second insulating layer 17 covers an upper side of each of the wiring electrodes 141 to 145, and defines second n-side openings 172, 174, 176, 178 and second p-side openings 171, 173, 175, and 177 at an upper side of a respective one of the light emitting cells 101 to 104.

In the first embodiment, of adjacent two light emitting cells 101 and 102 electrically connected to each other, the light emitting cell 101 is referred to as a first light emitting cell, and the light emitting cell 102 is referred to as a second light emitting cell. As shown in FIG. 7 and FIG. 8D, three wiring electrodes 141 to 143 are connected to the first light emitting cell 101 and the second light emitting cell 102.

The first wiring electrode 141 is electrically connected to the p-side semiconductor layer 12p of the first light emitting cell 101 via the first p-side opening 161 defined at an upper side of the first light emitting cell 101.

The second wiring electrode 142 is electrically connected to the n-side semiconductor layer 12n of the first light emitting cell 101 via the first n-side openings 16n defined at an upper side of the first light emitting cell 101. Further, the wiring electrode 142 is electrically connected to the p-side semiconductor layer 12p of the second light emitting cell 102 via the first p-side opening 162 defined at an upper side of the first light emitting cell 102.

The third wiring electrode 143 is electrically connected to the n-side semiconductor layer 12n of the second light emitting cell 102 via the first n-side openings 16n defined at an upper side of the first light emitting cell 102.

Figure 5A:
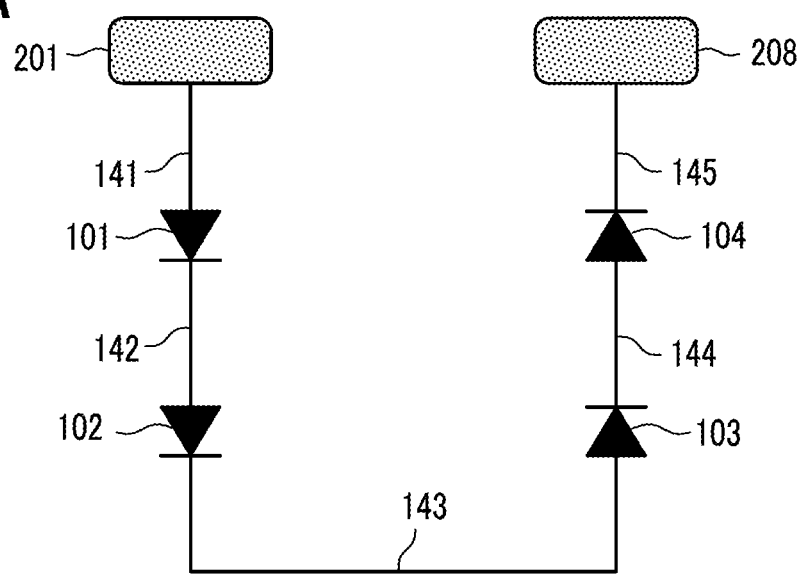
FIG. 5A is a circuit diagram illustrating an equivalent circuit of a plurality of light emitting cells electrically connected to each other.

The light emitting cells 101 to 104 (first to fourth light emitting cells 101 to 104) are electrically connected by the wiring electrodes 141 to 145 (first to fifth wiring electrodes 141 to 145) as shown in the equivalent circuit in FIG. 5A. The first wiring electrode 141 is connected to the first bonding member 201 that serves as a positive electrode of the light emitting element 2, and the fifth wiring electrode 145 is connected to the eighth bonding member 208 that serves as a negative electrode of the light emitting element 2. In the equivalent circuit diagrams, the electrodes with hatching are positive and negative electrodes of the light emitting element.

As shown in FIGS. 4, 5B, 7 and 8E, three wiring terminal 301 to 303 (first to third wiring terminals 301 to 303) are connected to the first light emitting cell 101 and the second light emitting cell 102.

The first wiring terminal 301 is electrically connected to the p-side semiconductor layer 12p of the first light emitting cell 101 via the first bonding member 201 in the second p-side opening 171 that corresponds to the first light emitting cell 101.

The second wiring terminal 302 is electrically connected to the n-side semiconductor layer 12n of the first light emitting cell 101 via the second bonding member 202 in the second n-side opening 172 that corresponds to the first light emitting cell 101. Further, the second wiring terminal 302 is electrically connected to the p-side semiconductor layer 12p of the second light emitting cell 102 via the third bonding member 203 in the second p-side opening 173 that corresponds to the second light emitting cell 102.

The third wiring terminal 303 is electrically connected to the n-side semiconductor layer 12n of the second light emitting cell 102 via the fourth bonding member 204 in the second n-side opening 174 that corresponds to the second light emitting cell 102.

In the light emitting device 1 having configurations as described above, the second wiring electrode 142 is electrically connected to the n-side semiconductor layer 12n of the first light emitting cell 101 and the p-side semiconductor layer 12p of the second light emitting cell 102. Further, the second bonding member 202 at an upper side of the first light emitting cell 101 and the third bonding member 203 at an upper side of the second light emitting cell 102 are electrically connected to the wiring electrode 142, and are connected to the second wiring terminal 302.

With this arrangement, potential difference between the second wiring electrode 142 and each of the bonding members 202 and 203 (second bonding member 202 and third bonding member 203) can be reduced, so that migration of metal material between the second wiring electrode 142 and each of the bonding members 202 and 203 can be reduced.

Further, the first light emitting cell 101 and the second light emitting cell 102 are electrically connected to each other via a conduction path through the second wiring electrode 142 and a conduction path through the second wiring terminal 302. Accordingly, if disconnection occurs in one of the two conduction paths, electrical conduction can be secured by the other of the two conduction paths. Thus, reliability of the light emitting device 1 according to the first embodiment can be increased.

Hereinafter, components of the light emitting device 1 will be sequentially described below in detail.

Structure of Mounting Substrate

The mounting substrate 3 is a member for mounting the light emitting element 2 on an upper surface thereof. As shown in FIG. 2, the mounting substrate 3 has a substantially rectangular shape in a plan view, and includes a base body 30 and a plurality of wiring terminals 301 to 306 (first to sixth wiring terminals 301 to 306) disposed on the base body 30.

The wiring terminals 301 to 306 (first to sixth wiring terminals 301 to 306) are electrically insulated from each other, and as shown in FIG. 2, are arranged in three rows and two columns at positions corresponding to positions where the bonding members 201 to 208 (first to eighth bonding members 201 to 208) of the light emitting element 2 are to be arranged.

In order to supply electric power from an external component to the light emitting element 2, for example, the first and sixth wiring terminals 301 and 306 can be used as a pair of wiring terminals for a power source, to each of which a respective one of wirings of an external power source such as an external driving circuit is to be connected. In this case, the first wiring terminal 301 is electrically connected to the first bonding member 201 that serves as a positive electrode of the light emitting element 2, and the sixth wiring terminal 306 is electrically connected to the eighth bonding member 208 that serves as a negative electrode of the light emitting element 2. Further, the external power source supplies electric power to the light emitting element 2 via the first and sixth wiring electrodes 301 and 306 and the first and eighth bonding members 201 and 208. This allows the light emitting cells 101 to 104 (first to fourth light emitting cells 101 to 104) to emit light.

The plurality of wiring terminals 301 to 306 (first to sixth wiring terminals) also serves as reflective films for reflecting light emitted downward from the light emitting element 2. For the wiring terminals 301 to 306, a material having good electrical conductivity and a high reflectance with respect to a wavelength of light emitted from the light emitting element 2 is preferably used. For example, in order to secure electrical conductivity, a wiring pattern may be formed using, for example, Ti/Pt/Au. Further, in order to improve reflectance, a single layer or a multi-layer that contains Ag, Al, Rh, etc., may be disposed on the surface of the wiring pattern.

For the base member 30, for example, ceramics such as aluminum nitride, metals, or resins may be used.

Structure of Light Emitting Element

As shown in FIG. 6 and FIG. 7, the light emitting element 2 has a substantially square shape when viewed from above, and includes the substrate 11, the semiconductor layered body 12, light-reflective electrodes 13, the first insulating layer 16, and the wiring electrodes 141 to 145 (first to fifth wiring electrodes 141 to 145). The light emitting element 2 further includes a light-reflective metal layer 15, which will be described below, the second insulating layer 17, and the bonding members 201 to 208 (first to eighth bonding members 201 to 208).

Substrate

The substrate 11 serves to support the semiconductor layered body 12. Further, the substrate 11 may be a growth substrate for epitaxially growing the semiconductor layered body 12. In the case in which nitride semiconductors are used for the semiconductor layered body 12, for example, a sapphire ($Al_2O_3$) substrate can be used for the substrate 11.

In the first embodiment, the substrate 11 is disposed at a lower surface side of the light emitting element 2. In the light emitting element 2, light is extracted mainly from a lower surface of the substrate 11. That is, in the light emitting element 2, a light extracting surface is a surface opposite to a surface at which the wiring electrodes 141 to 145 (first to fifth wiring electrodes 141 to 145), etc., are disposed, with respect to the semiconductor layered body 12. The bonding members 201 to 208 (first to eighth bonding members 201 to 208) are disposed at the upper surface side of the light emitting element 2, and the light emitting element 2 has a structure suitable for a mounting in a face-down manner, which allows light to be extracted from the lower surface side of the substrate 11.

Semiconductor Layered Body

As shown in FIG. 7, the semiconductor layered body 12 is disposed on the upper surface side of the substrate 11. In the semiconductor layered body 12, the n-side semiconductor layer 12n and the p-side semiconductor layer 12 are layered in order from the side of the upper surface of the substrate 11. As shown in FIG. 7, the active layer 12a is preferably disposed between the n-side semiconductor layer 12n and the p-side semiconductor layer 12p.

Figure 8A:
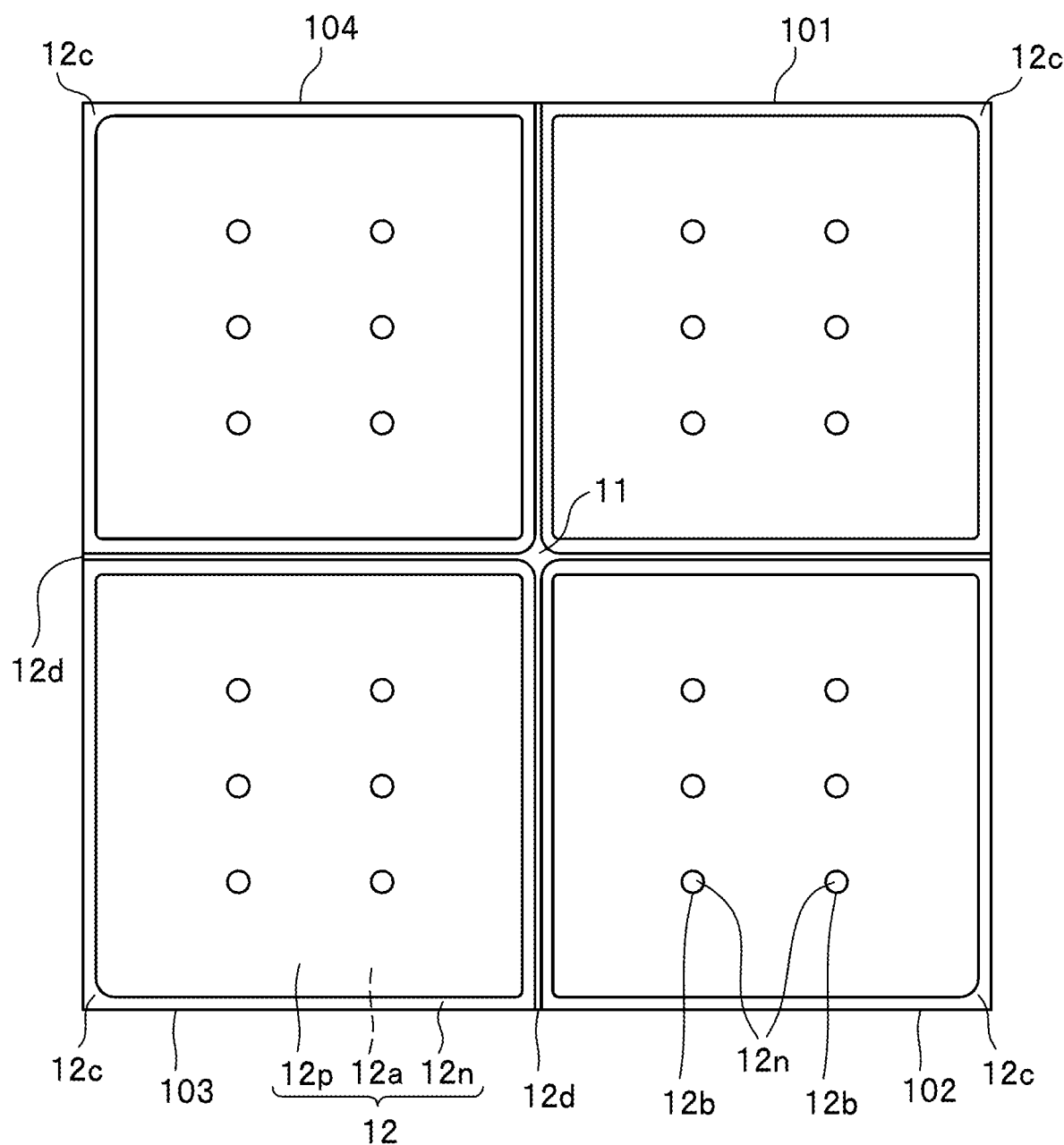
FIG. 8A is a schematic plan view for explaining a layer structure of the light emitting element according to the first embodiment, in which arrangement regions of an n-side semiconductor layer and a p-side semiconductor layer are shown.

As shown in FIG. 8A, in a plan view, the semiconductor layered body 12 is divided into four regions by a groove 12d having a cross shape in which a longitudinal groove portion and a lateral groove portion, which extends in a lateral direction perpendicularly to the longitudinal groove portion, intersect.

At a bottom portion of the groove 12d, the upper surface of the substrate 11 is exposed from the semiconductor layered body 12. Each of the four regions divided by the groove 12d corresponds to a respective one of the light emitting cells 101 to 104 (first to fourth light emitting cells 101 to 104). That is, the light emitting cells 101 to 104 are electrically independent from one another except for being connected via the wiring electrodes 142 to 144 (second to fourth wiring electrodes 142 to 144), i.e., as the four regions of the semiconductor layered body 12.

Each of the light emitting cells 101 to 104 has a substantially square shape in the first embodiment, but may alternatively have another polygonal shape such as a rectangular shape or a hexagonal shape, a circular shape, an elliptical shape, or the like. The number of light emitting cells is not limited to four, and two or more light emitting cells are provided.

Further, electrical connections among the plurality of light emitting cells is not limited to that all of the electrical connections are series connection, but the electrical connections may include a parallel connection.

In each of the light emitting cells 101 to 104 (first to fourth light emitting cells 101 to 104), the semiconductor layered body 12 includes a first exposed region 12b, which is a region where the p-side semiconductor layer 12p and the active layer 12a are absent and a portion of the n-side semiconductor layer 12n recessed from the p-side semiconductor layer 12p is exposed from the p-side semiconductor layer 12p. Each of the light emitting cells 101 to 104 includes six first exposed portions 12b, each of which has a substantially circular shape when viewed from above.

Further, in the semiconductor layered body 12, along a portion of an outer periphery of each of the light emitting cells 101 to 104, a second exposed region 12c, which is a region where the p-side semiconductor layer 12p and the active layer 12a are absent and a portion of the n-side semiconductor layer 12n is exposed, is formed.

For the n-side semiconductor layer 12n, the active layer 12a, and the p-side semiconductor layer 12p, for example, a nitride semiconductor such as $In_XAl_YGa_{1-X-Y}N$ (0≤X, 0≤Y, X+Y≤1) can be used.

Light-Reflective Electrode

Figure 8B:
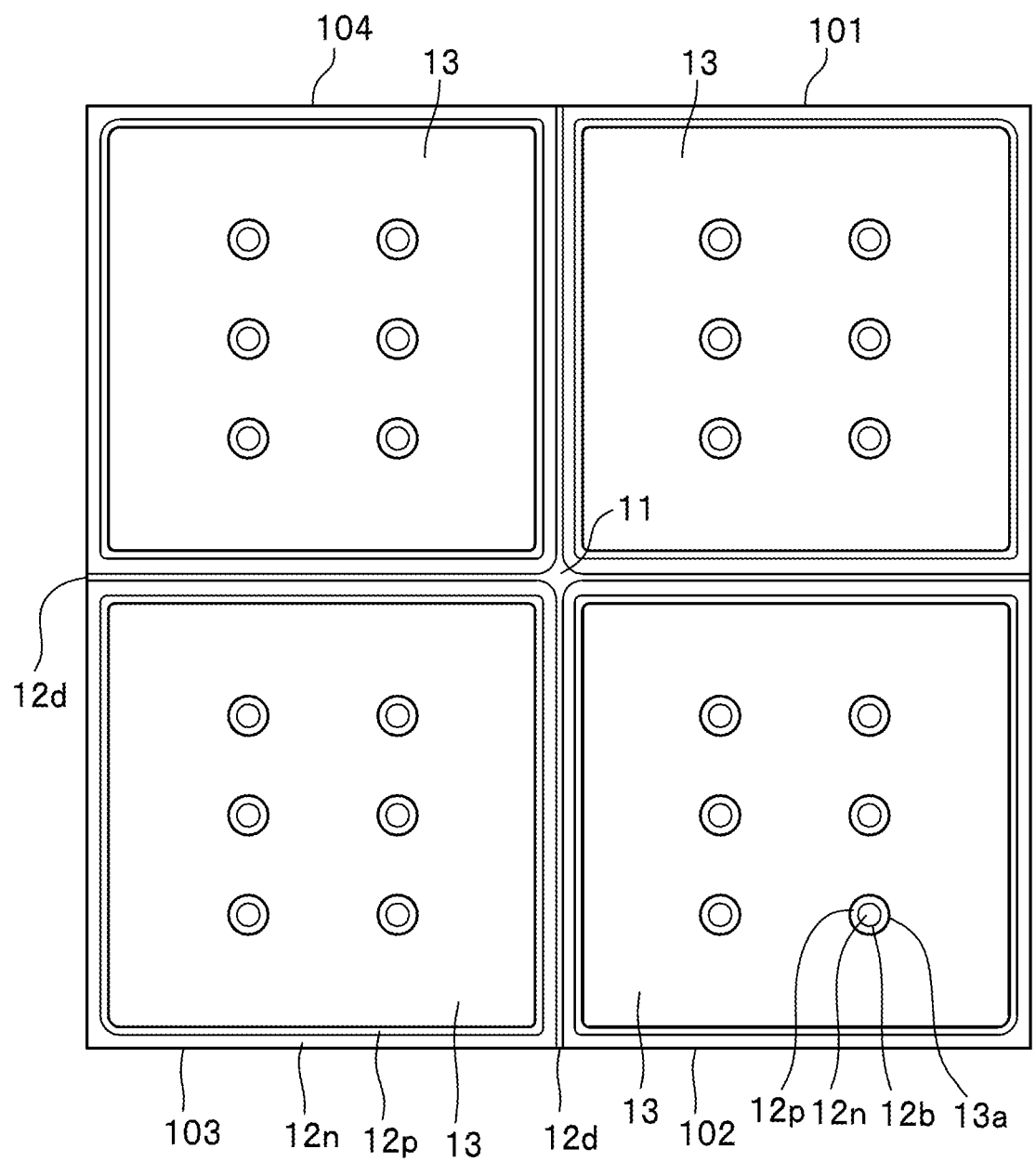
FIG. 8B is a schematic plan view for explaining the layer structure of the light emitting element according to the first embodiment, in which arrangement regions of light-reflective electrodes are shown.

As shown in FIG. 7 and FIG. 8B, each of the light-reflective electrodes 13 is disposed at an upper surface side of the p-side semiconductor layer 12p. Each of the light-reflective electrodes 13 serves as a current diffusion layer for diffusing current supplied from a respective one of the wiring electrodes 141 to 145 (first to fifth wiring electrodes 141 to 145) over a wide area in the p-side semiconductor layer 12p, and as a light-reflective layer. Each of the light-reflective electrodes 13 is disposed on substantially an entirety of an upper surface of the p-side semiconductor layer 12p of a respective one of the light emitting cells 101 to 104 (first to fourth light emitting cells 101 to 104).

Each of the light reflective electrodes 13 preferably includes a metal layer made of a metal material that has good electrical conductivity and good reflectivity. Examples of such a metal material include Ag, Al and an alloy of these metals.

First Insulating Layer

As shown in FIG. 7, the first insulating layer 16 is disposed on an upper surface side of the semiconductor layered body 12 and an upper surface side of the light-reflective electrodes 13. As shown in FIG. 7 and FIG. 8C, the first insulating layer 16 continuously covers lateral surfaces of the semiconductor layered structure 12 of each of the light emitting cells 101 to 104 (first to fourth light emitting cells 101 to 104), regions between the lateral surfaces of the semiconductor layered structure 12 of the light emitting cells 101 to 104, lateral surfaces 13a and an upper surface of each of the light-reflective electrodes 13, and the second exposed portions 12c. The expression the "regions between the lateral surfaces of the semiconductor layered structure 12" refers to, more specifically, the first exposed portions 12b and the groove 12d of each of the light emitting cells 101 to 104.

The first insulating layer 16 defines a plurality of the first n-side openings 16n in each of the light emitting cells 101 to 104. Each of the first n-side openings 16n has a circular shape and defined at a region where a respective one of the first exposed portions 12b is provided. Each of the wiring electrodes 142 to 145 (second to fifth wiring electrodes 142 to 145) on the first insulating layer 16 is electrically connected to the n-side semiconductor layer 12n in corresponding ones of the first n-side openings 16n.

The first insulating layer 16 defines the first p-side openings 161 to 164, each of which has a comb-like shape, in regions where the light-reflective electrodes 13 are disposed. Each of the wiring electrodes 141 to 144 (first to fourth wiring electrodes 141 to 144) on the first insulating layer 16 is electrically connected to the p-side semiconductor layer 12p via a respective one of the light-reflective electrodes 13 in a respective one of the first p-side openings 161 to 164.

The first insulating layer 16 protects the semiconductor layered structure 12 and the light-reflective electrodes 13, and insulates between each of the wiring electrodes 141 to 145 (first to fifth wiring electrodes 141 to 145) and the semiconductor layered structure 12 and between the light-reflective metal layer 15 and the semiconductor layered structure 12.

For the first insulating layer 16, for example, oxide or nitride containing at least one selected from the group consisting of Si, Ti, Zr, Nb, Ta, Al, and Hf can be used. Among these, $SiO_2$, which has a high light-transmissivity with respect to visible light and a low refractive index, is preferably used.

Wiring Electrode

As shown in FIG. 7 and FIG. 8D, the wiring electrodes 141 to 145 (first to fifth wiring electrodes) are disposed at the upper surface side of the semiconductor layered structure 12, the light-reflective electrodes 13, and the first insulating layer 16.

In each of the first light emitting cells 101 to 104 (first to fourth light emitting cells 101 to 104), a respective one of the wiring electrodes 142 to 145 (second to fifth wiring electrodes 142 to 145) is electrically connected to the n-side semiconductor layer 12n in the first n-side openings 16n of the first insulating layer 16 at the first exposed regions 12b.

Each of the wiring electrodes 141 to 144 (first to fourth wiring electrodes 141 to 144) is electrically connected to the p-side semiconductor layer 12p via the light-reflective electrode 13 in a respective one of the first p-side openings 161 to 164 above a respective one of the light-reflective electrodes 13 via the respective one of the light-reflective electrodes 13.

In the first embodiment, each of the wiring electrodes 141 to 145 (first to fifth wiring electrodes 141 to 145) serves as both a pad electrode of a respective one of the light emitting cells 101 to 104 (first to fourth light emitting cells 101 to 104) and a wiring that connects corresponding ones of the light emitting cells 101 to 104. Alternatively, pad electrodes may be disposed separately from the light emitting cells 101 to 104, and each of the wiring electrodes 141 to 145 may be connected to a respective one of the pad electrodes.

As shown in FIG. 7, in the first exposed portion 12b, the second exposed portion 12c, and the groove 12d, the wiring electrodes 141 to 145 cover the lateral surfaces of the light emitting cells 101 to 104 and regions therebetween via the first insulating layer 16.

The first wiring electrode 141 continuously covers an upper surface and lateral surfaces of the first light emitting cell 101. The second wiring electrode 142 continuously covers an upper surface and lateral surfaces of each of the first light emitting cell 101 and the second light emitting cell 102, and a region between the lateral surfaces of the first light emitting cell 101 and the second light emitting cell 102.

The third wiring electrode 143 electrically connects the n-side semiconductor layer 12n of the second light emitting cell 102 and the p-side semiconductor layer 12p of the third light emitting cell 103. The third wiring electrode 143 continuously covers an upper surface and lateral surfaces of the second and third light emitting cells 102 and 103 and a region between the lateral surfaces of light emitting cells 102 and 103.

The fourth wiring electrode 144 electrically connects the n-side semiconductor layer 12n of the third light emitting cell 103 and the p-side semiconductor layer 12p of the fourth light emitting cell 104. The fourth wiring electrode 144 continuously covers an upper surface and lateral surfaces of each of the third and fourth light emitting cells 103 and 104, and a region between the lateral surfaces of the light emitting cells 103 and 104.

The fifth wiring electrode 145 electrically connects the n-side semiconductor layer 12n of the fourth light emitting cell 104 and the eighth bonding member 208. The fifth wiring electrode 145 continuously covers the upper surface and lateral surfaces of the emitting cell 104.

As in the first embodiment, arranging the wiring electrodes 142 to 144 (second to fourth wiring electrodes 142 to 144) successively on the plurality of light emitting cells 101 to 104 (first to fourth light emitting cells 101 to 104) allows the wiring electrodes 142 to 144 to be disposed on the groove 12d formed between adjacent ones of the light emitting cells 101 to 104. The semiconductor layered structure 12 is removed at the groove 12d, so that height difference is increased between the upper surface of each semiconductor layered structure 12 and a bottom surface of the groove 12d. Accordingly, the wiring electrodes 142 to 144 (second to fourth wiring electrodes 142 to 144) are not easily disposed in the groove 12d, and portions of the wiring electrodes 142 to 144 in the groove 12d tends to have a lower quality. Similarly, the first insulating layer 16 is not easily formed, which may have a bad effect on the wiring electrodes 142 to 144 on the first insulating layer 16. Due to these factors, disconnection may occur in portions of the wiring electrodes 142 to 144 in the groove 12d. On the other hand, in the first embodiment, for example, between the first light emitting cell 101 and the second light emitting cell 102, two conductive paths, that is, an electrical conduction path through the second wiring electrode 142 and an electrical conduction path through the second wiring terminal 302, are provided. Accordingly, even if disconnection occurs in one of the conduction paths, electrical conduction between the first light emitting cell 101 and the second light emitting cell 102 can be secured. More specifically, even if disconnection occurs in the conduction path through the second wiring electrode 142, which have a possibility of disconnection, electrical conduction can be secured by the conduction path through the second wiring terminal 302. Accordingly, reliability of the light emitting device 1 can be improved. In the first embodiment, electrical resistance of the wiring electrodes 141 to 145 (first to fifth wiring electrodes 141 to 145) is lower than electrical resistance of the wiring terminals 301 to 306 (first to sixth wiring terminals 301 to 306) and the bonding members 201 to 208 (first to eighth bonding members 201 to 208), so that current flows mainly in the conduction path through the wiring electrodes 141 to 145.

Each of the wiring electrodes 141 to 145 (first to fifth wiring electrodes 141 to 145) preferably disposed to cover at least a portion of each of the lateral surfaces of corresponding one or more of the light emitting cells 101 to 104 (first to fourth light emitting cells 101 to 104), and is more preferably disposed to continuously cover lateral surfaces of the active layer 12a of corresponding one or more of the light emitting cells 101 to 104. With this arrangement, each of the wiring electrodes 141 to 145 can reflect light emitted from the lateral surfaces of each of the light emitting cells 101 to 104, and light leaked from the lateral surfaces of the light emitting cells 101 to 104 can be reduced, so that light extraction efficiency of the light emitting device 1 can be increased.

Each of the wiring electrodes 141 to 145 (first to fifth wiring electrodes 141 to 145) preferably includes a metal layer made of a metal material having good conductivity and good reflectivity. Examples of such a metal material include Ag, Al and an alloy of these metals. Al and Al alloy respectively have a high light reflectivity, and less easily migrates than Ag, and thus can be suitably used for the wiring electrodes 141 to 145.

Light-Reflective Metal Layer

As shown in FIG. 8D, the light-reflective metal layer 15 is disposed on the upper surface side of the first insulating layer 16 in a region where the wiring electrodes 141 to 145 (first to fifth wiring electrodes 141 to 145) are not disposed. The light-reflective metal layer 15 is a light-reflective metal layer continuously covering lateral surfaces of the light emitting cells 101 to 104 (first to fourth light emitting cells 101 to 104) and a region therebetween, i.e., the second exposed portions 12c and the groove 12d, via the first insulating layer 16. With the wiring electrodes 142 to 144 (second to fourth wiring electrodes 142 to 144) and the light-reflective metal layer 15 that cover the lateral surfaces of the light emitting cells 101 to 104 and the region between the lateral surfaces of the light emitting cells 101 to 104, light leaking from the lateral surfaces of the light emitting cells 101 to 104 and therebetween can be reduced.

For the light-reflective metal layer, a material similar to a material of the wiring electrodes 141 to 145 (first to fifth wiring electrodes 141 to 145) can be used. The light-reflective metal layer 15 is not electrically connected to any one of the wiring electrodes 141 to 145.

Second Insulating Layer

As shown in FIG. 7 and FIG. 8E, the second insulating layer 17 is disposed on the upper surface side of first insulating layer 16, the upper surface side of the wiring electrodes 141 to 145 (first to fifth wiring electrodes 141 to 145), and the upper surface side of the light-reflective electrodes 15.

The second insulating layer 17 defines a second p-side opening 171 on a portion of an upper surface of the first wiring electrode 141.

The second insulating layer 17 defines a second n-side opening 172 and a second p-side opening 173 on portions of an upper surface of the second wiring electrode 142.

The second insulating layer 17 defines a second n-side opening 174 and a second p-side opening 175 on portions of an upper surface of the third wiring electrode 143.

The second insulating layer 17 defines a second n-side opening 176 and a second p-side opening 177 on portions of an upper surface of the fourth wiring electrode 144.

The second insulating layer 17 defines a second p-side opening 178 on a portion of an upper surface of the fifth wiring electrode 145.

The second p-side openings 171, 173, 175, and 177 and the second n-side openings 172, 174, 176, and 178 respectively have a comb-like shape in the first embodiment, but any appropriate number and shapes of the second p-side openings and the second n-side openings may be employed.

Each of the second p-side openings 171, 173, 175, and 177 of the second insulating layer 17 has an E-shape when viewed from above, which is substantially the same as the shape of each of the first p-side openings 161, 162, 163, and 164 of the first insulating layer 16 when viewed from above. Further, each of the second p-side openings 171, 173, 175, and 177 has an area smaller than an area of a respective one of the first p-side openings 161, 162, 163, and 164.

The second insulating layer 17 is a protective film that protects the wiring electrodes 141 to 145 (first to fifth wiring electrodes 141 to 145) and the light-reflective metal layer 15. For the second insulating layer 17, a material similar to a material used for the first insulating layer 16, as described above, is preferably used. Meanwhile, different materials may be used for the first insulating layer 16 and the second insulating layer 17.

Bonding Member

Figure 8F:
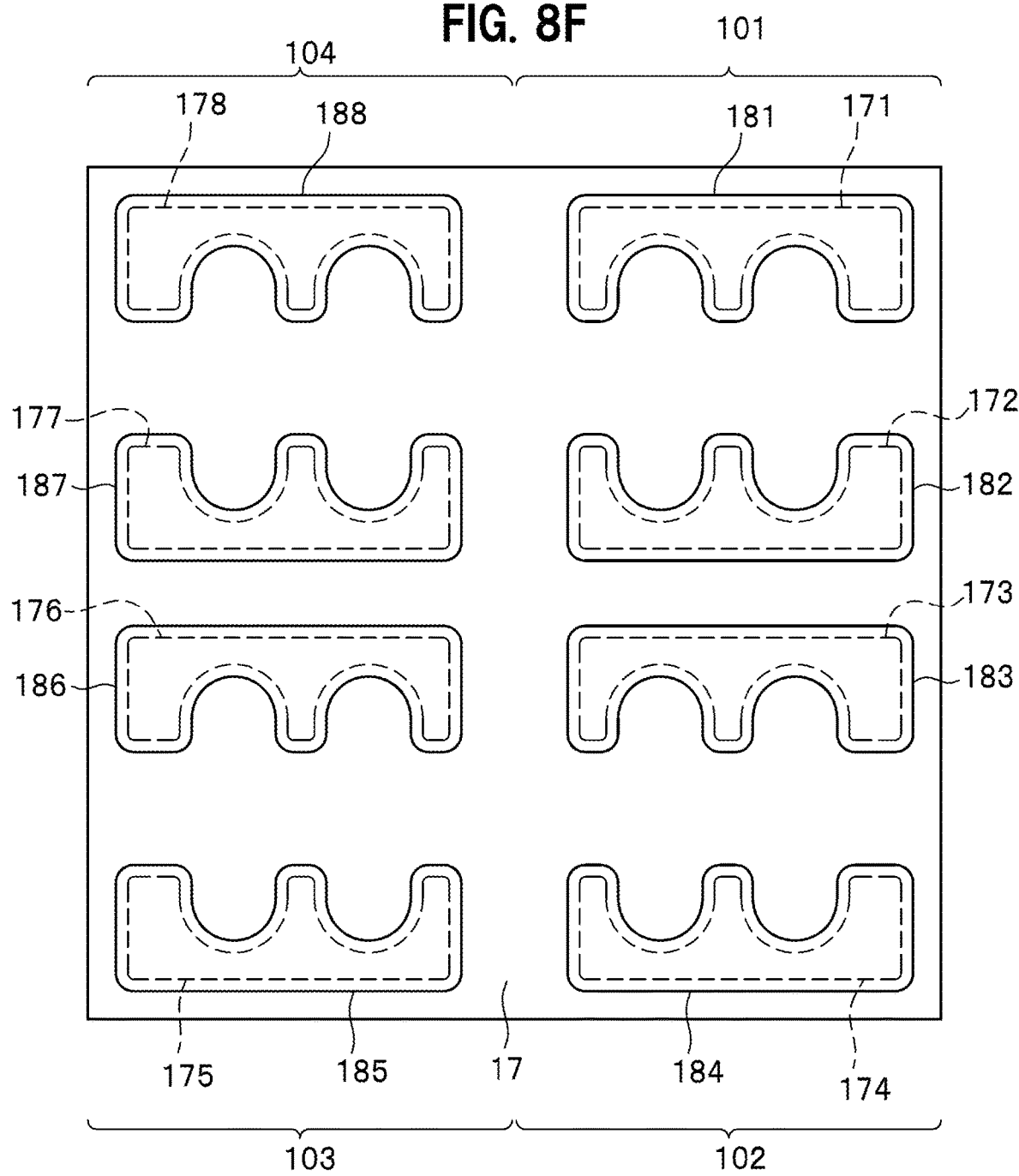
FIG. 8F is a schematic plan view for explaining the layer structure of the light emitting element according to the first embodiment, in which arrangement regions of metal layers of bonding members are shown.
Figure 10A:
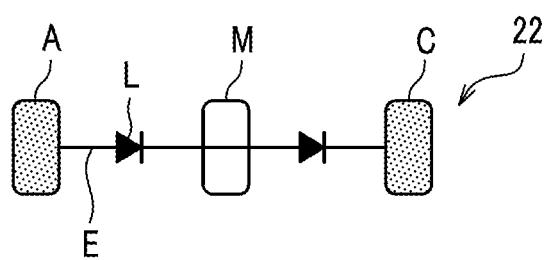
FIG. 10A is a circuit diagram illustrating an equivalent circuit of a light emitting element according to another variant example of the first embodiment.
Figure 10B:
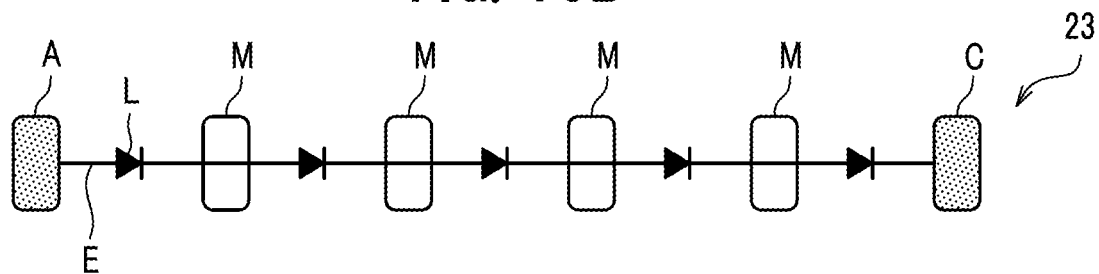
FIG. 10B is a circuit diagram illustrating an equivalent circuit of a light emitting element according to even another variant example of the first embodiment.

As shown in FIGS. 7, 8F, and 8G the bonding members 201 to 208 (first to eighth bonding members 201 to 208) are disposed on the upper surface side of the wiring electrodes 141 to 145 (first to fifth wiring electrodes 141 to 145) and the upper surface side of second insulating layer 17. Each of the bonding members 201 to 208 is a member for electrically connecting a corresponding one of the wiring electrodes 141 to 145 and a corresponding one of the wiring terminals 301 to 306 (first to fifth wiring terminals 301 to 306). In the first embodiment, the bonding members 201 to 208 include metal layers 181 to 188, and conductive members 191 to 198 on the metal layers 181 to 188, respectively. As shown in FIG. 8F, each of the metal layers 181 to 188 has an E-shape when viewed from above, which is substantially the same as the shape of each of the second p-side and n-side openings 171 to 178 of the second insulating layer 17 when viewed from above. Each of the metal layers 181 to 188 has an area larger than an area of a respective one of the second p-side and n-side openings 171 to 178 of the second insulating layer 17.

The first bonding member 201 is connected to the upper surface of the first wiring electrode 141 in the second p-side opening 171 of the second insulating layer 17. Further, the first wiring electrode 141 is electrically connected to the p-side semiconductor layer 12p of the first light emitting cell 101 in the first p-side opening 161 of the first insulating layer 16 via the light-reflective electrode 13. Thus, the first bonding member 201 functions as a p-side electrode of the first light emitting cell 101.

The second bonding member 202 is connected to the upper surface of the second wiring electrode 142 in the second n-side opening 172 of the second insulating layer 17. Further, the second wiring electrode 142 is electrically connected to the n-side semiconductor layer 12n of the first light emitting cell 101 in the first n-side openings 16n of the first insulating layer 16. Thus, the second bonding member 202 functions as an n-side electrode of the first light emitting cell 101.

The third bonding member 203 is connected to the upper surface of the second wiring electrode 142 in the second p-side opening 173 of the second insulating layer 17. Further, the second wiring electrode 142 is electrically connected to the p-side semiconductor layer 12p of the first light emitting cell 102 in the first p-side opening 162 of the first insulating layer 16 via the light-reflective electrode 13. Thus, the third bonding member 203 functions as a p-side electrode of the second light emitting cell 102.

The fourth bonding member 204 is connected to the upper surface of the third wiring electrode 143 in the second n-side opening 174 of the second insulating layer 17. Further, the third wiring electrode 143 is electrically connected to the n-side semiconductor layer 12n of the second light emitting cell 102 in the first n-side openings 16n of the first insulating layer 16. Thus, the fourth bonding member 204 functions as an n-side electrode of the second light emitting cell 102.

The fifth bonding member 205 is connected to the upper surface of the third wiring electrode 143 in the second p-side opening 175 of the second insulating layer 17. Further, the third wiring electrode 143 is electrically connected to the p-side semiconductor layer 12p of the third light emitting cell 103 in the first p-side opening 163 of the first insulating layer 16 via the light-reflective electrode 13. Thus, the fifth bonding member 205 functions as a p-side electrode of the third light emitting cell 103.

The sixth bonding member 206 is connected to the upper surface of the fourth wiring electrode 144 in the second n-side opening 176 of the second insulating layer 17. Further, the fourth wiring electrode 144 is electrically connected to the n-side semiconductor layer 12n of the third light emitting cell 103 in the first n-side openings 16n of the first insulating layer 16. Thus, the sixth bonding member 206 functions as an n-side electrode of the third light emitting cell 103.

The seventh bonding member 207 is connected to the upper surface of the fourth wiring electrode 144 in the second p-side opening 177 of the second insulating layer 17. Further, the fourth wiring electrode 144 is electrically connected to the p-side semiconductor layer 12p of the first light emitting cell 104 in the first p-side opening 164 of the first insulating layer 16 via the light-reflective electrode 13. Thus, the seventh bonding member 207 functions as a p-side electrode of the fourth light emitting cell 104.

The eighth bonding member 208 is connected to the upper surface of the fifth wiring electrode 145 in the second n-side opening 178 of the second insulating layer 17. Further, the fifth wiring electrode 145 is electrically connected to the n-side semiconductor layer 12n of the fourth light emitting cell 104 in the first n-side openings 16n of the first insulating layer 16. Thus, the eighth bonding member 208 functions as an n-side electrode of the fourth light emitting cell 104.

When viewed from above, an entirety of each of the bonding member 201 to 208 (first to eight bonding members 201 to 208) is disposed at an inner side of a periphery of a corresponding one of the light emitting cells 101 to 104 (first to fourth light emitting cells 101 to 104). As shown in FIG. 3 and FIG. 6, when viewed from above, for example, an entirety of the first bonding member 201 is disposed in a region where the first wiring electrode 141 is disposed in the first light emitting cell 101. Further, when viewed from above, an entirety of the second bonding member 202 is disposed in a region where the second wiring electrode 142 is disposed in the first light emitting cell 101. Even further, when viewed from above, an entirety of the third bonding member 203 is disposed in a region where the second wiring electrode 142 is disposed in the second light emitting cell 102. That is, the bonding members 201 to 208 (first to eighth bonding members 201 to 208) are disposed such that each of the bonding members 201 to 208 is not disposed over a plurality of wiring electrodes 141 to 145 (first to fifth wiring electrodes 141 to 145) with different electric potentials among the wiring electrodes 141 to 145 on the light emitting cells 101 to 104 (first to fourth light emitting cells 101 to 104). With this arrangement, a potential difference between each of the bonding members 201 to 208 and a corresponding one of the wiring electrodes 141 to 145 can be reduced, compared with a configuration in which each of the bonding members 201 to 208 is disposed over, of the wiring electrodes 141 to 145, wiring electrodes that have different electric potentials. Accordingly, for example, if the second insulating layer 17 has defects, migration of a metal material between the bonding members 201 to 208 and the wiring electrodes 141 to 145 can be reduced.

The first and second bonding members 201 and 208 serve as electrodes to which the first and sixth wiring terminals 301 and 306 of the mounting substrate 3 are connected, respectively. The bonding members 202 to 207 (second to seventh bonding members 202 to 207) serve as electrodes to each of which a corresponding one of the wiring terminals 302 to 305 (second to fifth wiring terminals 302 to 305) of the mounting substrate 3 are connected.

In the first embodiment, each of the bonding members 201 to 208 is connected to corresponding one of the wiring terminals 301 to 306, allowing for determining a specific light emitting cell in which leakage occurs among the light emitting cells 101 to 104 (first to fourth light emitting cells 101 to 104) electrically connected to each other via the bonding members 201 to 208. Occurrence of leakage current in a specific light emitting cell can be determined, for example, in the light emitting cell 101 connected to the first bonding member 201 and the second bonding member 202, by applying voltage between the first wiring terminal 301, which is electrically connected to the first bonding member 201, and the second wiring terminal 302, which is electrically connected to the second bonding member 202, and measuring a current value.

The metal layers 181 to 188 are seed layers for forming the conductive members 191 to 198, respectively, by using a plating method. The seed layers are metal layers that serve as current paths at the time of forming the conductive members 191 to 198, and can be formed by using a sputtering method, a vapor deposition, or the like. Each of the seed layers preferably includes a metal layer made of a metal material having good conductivity and good reflectivity. Examples of such a metal material include Al, Ag, Al alloy, and Ag alloy. Further, the seed layers is preferably disposed such that the metal layer made of Al, Ag, Al alloy or Ag alloy is in contact with the second insulating layer 17. With this arrangement, light emitted from the light emitting cells 101 to 104 (first to fourth light emitting cells 101 to 104) can be efficiently reflected toward a second insulating layer 17 side.

Examples of a material of the conductive members 191 to 198 include metals such as Cu, Au, and Ni. Further, each of the conductive members 191 to 198 may have a layered structure in which a plurality of metals are used. In order to prevent corrosion and enhance bondability with the mounting substrate via an Au alloy-based bonding material such as Au—Sn eutectic solder, at least an uppermost layer of each of the conductive members 191 to 198 is preferably made of Au.

As described above, as shown in FIGS. 1 to 7, in the light emitting device 1 according to the first embodiment, the second wiring terminal 302 on the mounting substrate 3 is electrically connected to the n-side semiconductor layer 12n of the first light emitting cell 101 via the second bonding member 202, and is electrically connected to the p-side semiconductor layer 12p of the second light emitting cell 102 via the third bonding member 203.

Further, the first light emitting cell 101 and the second light emitting cell 102 are electrically connected to each other via the second wiring electrode 142. More specifically, the second wiring electrode 142 electrically connects the n-side semiconductor layer 12n of the first light emitting cell 101 and the p-side semiconductor layer 12p of the second light emitting cell 102.

In the light emitting device 1 according to the present embodiment, the third wiring terminal 303 on the mounting substrate 3 is electrically connected to the n-side semiconductor layer 12n of the second light emitting cell 102 via the fourth bonding member 204. Further, the fourth wiring terminal 304 on the mounting substrate 3 is electrically connected to the p-side semiconductor layer 12p of the third light emitting cell 103 via the fifth bonding member 205.

Even further, the second and third light emitting cells 102 and 103 are electrically connected to each other via the third wiring electrode 143. More specifically, the third wiring electrode 143 electrically connects the n-side semiconductor layer 12n of the second light emitting cell 102 and the p-side semiconductor layer 12p of the third light emitting cell 103.

In the light emitting device 1 according to the first embodiment, the fifth wiring terminal 305 on the mounting substrate 3 is electrically connected to the n-side semiconductor layer 12n of the third light emitting cell 103 via the sixth bonding member 206, and is electrically connected to the p-side semiconductor layer 12p of the fourth light emitting cell 104 via the seventh bonding member 207.

Further, the third and fourth light emitting cells 103 and 104 are electrically connected to each other via the fourth wiring electrode 144. More specifically, the fourth wiring electrode 144 electrically connects the n-side semiconductor layer 12n of the third light emitting cell 103 and the p-side semiconductor layer 12p of the fourth light emitting cell 104.

In the light emitting device 1 with such a structure, when the external power source is connected to the light emitting device 1, difference between, for example, the electric potential of the wiring terminals other than the first and sixth wiring terminals 301 and 306 and the electric potential of their corresponding wiring electrodes can be reduced. For example, as shown in FIG. 4, when an external power source of 12V is connected to the first wiring terminal 301 and the sixth wiring terminal 306 and a voltage of 3V is applied to each of the light emitting cells 101 to 104 (first to fourth light emitting cells 101 to 104) to cause to emit light, the first wiring terminal 301 exhibits an electric potential of approximately 12V, and similarly, the first bonding member 201, the first wiring electrode 141, and the p-side semiconductor layer 12p of the first light emitting cell 101, which are electrically connected to the first wiring terminal 301, exhibit electric potentials of approximately 12V. Further, the electric potential of the second wiring electrode 142 electrically connected to the n-side semiconductor layer 12n of the first light emitting cell 101 is approximately 9V, and similarly, the electric potential of each of the second and third bonding members 202 and 203, the second wiring terminal 302, and the p-side semiconductor layer 12p of the second light emitting cell 102, which are electrically connected to the second wiring electrode 142, is approximately 9V. That is, there is substantially no difference between the electric potential of the second wiring terminal 302 of the mounting substrate 3 and the electric potential of each of the second and third bonding members 202 and 203 and the second wiring electrode 142, which are electrically connected to the second wiring terminal 302. Similarly, there is substantially no difference in the electric potential between the third wiring terminal 303 and the fourth bonding member 204, between the fourth wiring terminal 304 and the fifth bonding member 205, between the fifth wiring terminal 305 and the sixth and seventh bonding members 206, 207, and between the sixth wiring terminal 306 and the eighth bonding member 208. Accordingly, migration of a material of a component of the light emitting device 1, e.g., the bonding member, due to potential difference can be reduced, so that reliability of the light emitting device 1 can be improved.

Further, with the wiring electrodes 141 to 145 (first to fifth wiring electrodes 141 to 145) and the light-reflective metal layer 15, light leaked from the lateral surfaces of the light emitting cells 101 to 104 (first to fourth light emitting cells 101 to 104) can be reduced, so that light extraction efficiency can be increased.

Accordingly, in the light emitting device 1, the light extraction efficiency can be improved while maintaining reliability. Further, the area of each of the wiring terminals 301 to 306 (first to sixth wiring terminals 301 to 306) on the mounting substrate 3 can be relatively increased, so that mountability between the light emitting element 2 and the mounting substrate 3 and heat dissipation performance can be increased.

Next, with reference to FIG. 9A to FIG. 10B, a light emitting device according to several variant examples of the first embodiment will be described comparing with an equivalent circuit shown in FIG. 5B.

FIG. 9A is a circuit diagram illustrating an equivalent circuit of the light emitting element 2A according to a first variant example of the first embodiment.

Figure 5B:
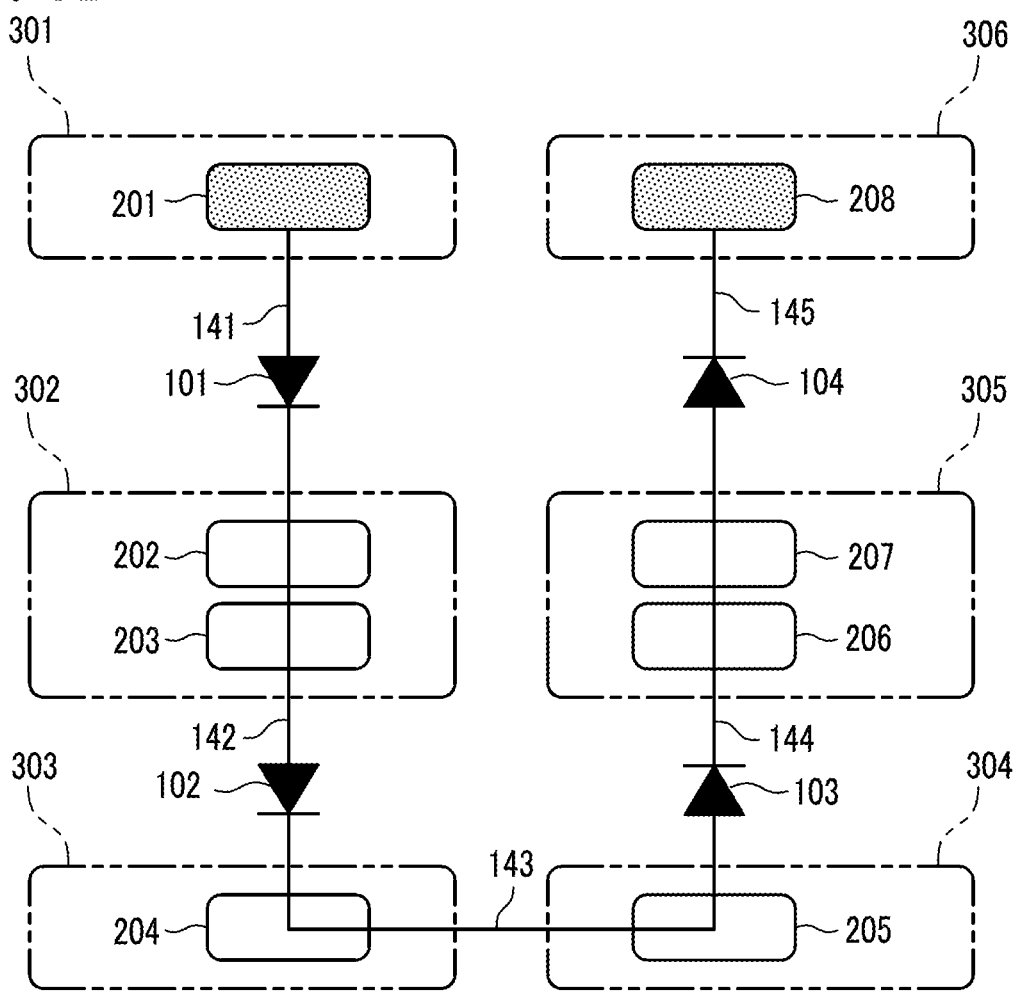
FIG. 5B is a circuit diagram illustrating an equivalent circuit of the light emitting element according to the first embodiment.

The same reference numerals will be applied to the components that have the same or similar structure as those shown in FIG. 9A and FIG. 5B, and descriptions thereof will be appropriately omitted.

First Variant Example of First Embodiment

In a first variant example of the first embodiment, an entirety of at least one of the bonding members 201 to 208 is disposed over two adjacent light emitting cells. For example, a bonding member 212 shown in FIG. 9A corresponds to an integral body of the bonding member 202 and the bonding member 203 in FIG. 5B. The bonding member 212 can be formed by, for example, integrally forming the metal layers 182 and 183 shown in FIG. 8F, and similarly, integrally forming the conductive member 192 and 193 to form a single bonding member. The light emitting device according to the first variant example has an effect similar to that in the first embodiment.

Further, as shown in FIG. 9A, the wiring terminals 303 and 304 in the first embodiment corresponds to a single wiring terminal 313 in the first variant example. For example, in FIG. 9A, a mounting substrate including five wiring terminals 301, 302, 313, 305, and 306 that correspond to the light emitting element 2A is illustrated, and the wiring terminal 303 and 304 in FIG. 5B collectively corresponds to a single terminal such as a wiring terminal 313. In the light emitting device including such a mounting substrate, respective adjacent light emitting cells electrically connected by a corresponding one of the wiring electrodes 142 to 144 are also electrically connected by a corresponding one of the wiring terminals 302, 313, and 305. That is, two conductive paths, i.e., a conductive path through a respective one of the wiring electrodes and a conductive path through a respective one of the wiring terminals, are provided each of between a first light emitting cell 101 and a second light emitting cell 102, between the second light emitting cell 102 and the light emitting cell 103, and between the light emitting cell 103 and the light emitting cell 104. With this arrangement, electrical conductive path between respective ones of light emitting cells can be secured even if disconnection occurs in a portion of its corresponding wiring electrode or wiring terminal, in particular, a portion of its corresponding wiring terminal. Thus, the light emitting device according to the first variant example has an effect of enhancing reliability. In FIG. 9A, a single bonding member 214, which corresponds to an integral body of the bonding member 204 and 205, is disposed with respect to the wiring electrode 313, but individual bonding members 204 and 205 as shown in FIG. 5B may alternatively be disposed.

Further, in the example FIG. 9A, a combination of the bonding member 212 in the first variant example and the wiring terminal 313 is shown, but these may not be used in combination and may be individually used.

Second Variant Example of First Embodiment

In the first embodiment, the four light emitting cells 101 to 104 are arranged in two rows and two columns when viewed from above and connected by the wiring electrodes 141 to 145 and the wiring terminals 301 to 306 in a folding manner, but other appropriate arrangement and/or connection may be alternatively employed. As shown in FIG. 9B, in a second variant example of the first embodiment, the four light emitting cells 101 to 104 are linearly arranged, and are connected via the wiring electrodes 141 to 145 and the wiring terminals 301, 302, 313, 305, and 306. The same reference numerals will be applied to the components that have the same or similar structure as those shown in FIG. 9A and FIG. 9B, and descriptions thereof will be appropriately omitted. A bonding member 216 shown in FIG. 9B corresponds to an integral body of the bonding member 206 and the bonding member 207 in FIG. 9A.

In the equivalent circuit diagram shown in FIG. 9B, a combination of the first variant example and the second variant example is employed, but they may be individually employed.

With this arrangement, as shown in FIG. 9B, in a light emitting element 2B, the wiring terminals 301, 302, 313, 305, and 306 and the bonding members 201, 212, 214, 216, and 208, are provided with one to one relation. Accordingly, by omitting illustration of the wiring terminals, which are indicated by two-dot chain lines, in FIG. 9B, a simple circuit diagram of a light emitting element as shown in FIG. 9C can be obtained. The simple equivalent circuit diagram of the light emitting element 21 shown in FIG. 9C is substantially equivalent to the equivalent circuit diagram of the light emitting element 2B in FIG. 9B, in which the reference numerals of constituting components is changed from those in the light emitting element 2B as below.

A numeral "A" corresponds to the bonding member 201, which functions as a positive electrode of the light emitting element 2B.

A numeral "C" corresponds to the bonding member 208, which functions as a negative electrode of the light emitting element 2B.

A numeral "M" corresponds to each of the bonding members that function as electrodes between the numeral "A" and the numeral "C". Each of the bonding members indicated by the numerals A, C, and M may be referred to as an electrode in the description below.

A numeral "L" indicates each of the light emitting cells, and a numeral "E" corresponds to each of the wiring electrodes.

Each of the numerals A, C, M, L and E may be provided with an identification number as necessary.

In the description above, four light emitting cells are provided, but other appropriate number of the light emitting cells may be alternatively provided. For example, two light emitting cells L may be disposed as in the light emitting element 22 shown in FIG. 10A, or five light emitting cells L may be disposed as in the light emitting element 23 shown in FIG. 10B. Thus, a plurality of the light emitting cells L is disposed.

In the light emitting elements 21 to 23 according to certain variant examples of the first embodiment, and the light emitting device including any one of the light emitting element 21 to 23, a light emitting cell L is disposed between the electrode A and the electrode M, another light emitting cell L is disposed between the electrode M and the electrode M, and even another light emitting cell L is disposed between the electrode M and the electrode C. Accordingly, in a inspecting step in which the plurality of light emitting cells are inspected, if leakage occurs in any of the light emitting cells, the light emitting cell in which leakage occurs can be detected by applying voltage between the electrodes as described above and measuring a current value.

Second Embodiment

Figure 11A:
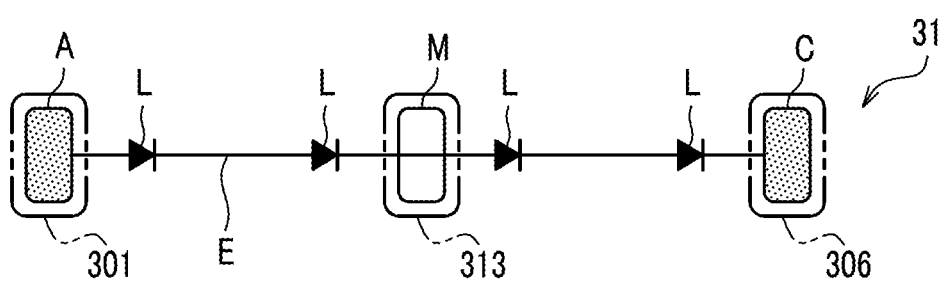
FIG. 11A is a circuit diagram illustrating an equivalent circuit of a light emitting element according to a second embodiment.

In the light emitting element according to the second embodiment, as shown in FIG. 11A, a plurality of light emitting cells is disposed between the electrode A and the electrode M, and another plurality of light emitting cells is disposed between the electrode M and the electrode C. That is, in the light emitting device according to the present embodiment, the number of wiring terminals with respect to the number of the light emitting cells is smaller than in the light emitting device according to the variant examples of the first embodiment, and a plurality of light emitting cells is connected between the wiring terminals. More specifically, in the light emitting element 31, two light emitting cells are connected between the wiring terminals 301 and 313, and other two light emitting cells are connected between the wiring terminals 313 and 306.

The light emitting element according to the second embodiment has a structure such that, for example, the wiring terminals 302 and 305 and the bonding member 212 and 216, which are arranged at both sides of the wiring terminal 313 in FIG. 9B to be connected with the bonding member 214, are omitted from the equivalent circuit shown in FIG. 9B.

This structure is equivalent to an equivalent circuit having a structure such that two electrodes M at both sides of an electrode M at the center of the light emitting element 21 in the simplified equivalent circuit diagram shown in FIG. 9C are omitted from the equivalent circuit shown in FIG. 9C.

In the present embodiment, the two light emitting cells L, which are connected between the wiring terminals 301 and 313, are connected via the wiring electrodes E, so that the openings 176 and 177 for conducting between the bonding members shown in FIG. 8F and the semiconductor layered structure 12 may not be defined in the second insulating layer 17.

Figure 11B:
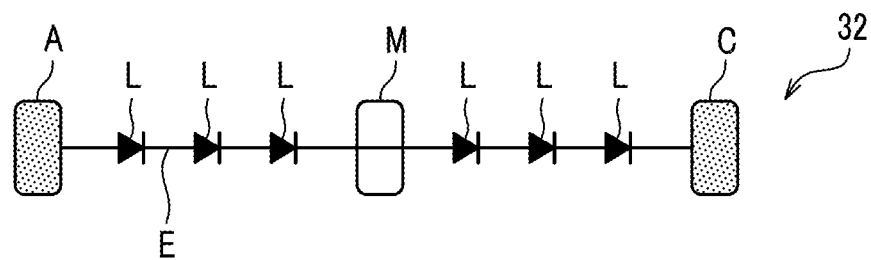
FIG. 11B is a circuit diagram illustrating an equivalent circuit of a light emitting element according to a variant example of the second embodiment.

In the light emitting element 31, two light emitting cells L are disposed between the electrode A and the electrode M, and other two light emitting cells L are disposed between the electrode M and the electrode C, but any appropriate number of the light emitting cells L may be disposed between the electrode A and the electrode M and between the electrode M and the electrode C. For example, as in a light emitting element 32 shown in FIG. 11B, three light emitting cells L are disposed between the electrode A and the electrode M, and other three light emitting cells L are disposed between the electrode M and the electrode C.

The light emitting device according to the second has an effect similar to that in the first embodiment and an effect as described below. Compared to the case in which, for example, four light emitting cells having the same size when viewed from above and arranged in two rows and two columns as in the first embodiment are connected in a folding manner, in the case in which eight light emitting cells arranged in two rows and four columns are connected in a folding manner, regions where the wiring terminals corresponding to a corresponding one of light emitting cells are to be disposed are not easily secured. In such a case, reduction in size of each of the wiring terminals allows the wiring terminals to be disposed on the regions, but may lead to deterioration of mountability between the light emitting element and the mounting substrate and heat dissipation performance. However, according to the present embodiment, the number of the wiring terminals can be reduced, and the area of each of the wiring terminals 301 to 306 on the mounting substrate 3 can be relatively increased, so that mountability between the light emitting element 2 and the mounting substrate 3 and heat dissipation performance can be improved.

Third Embodiment

Figure 12:
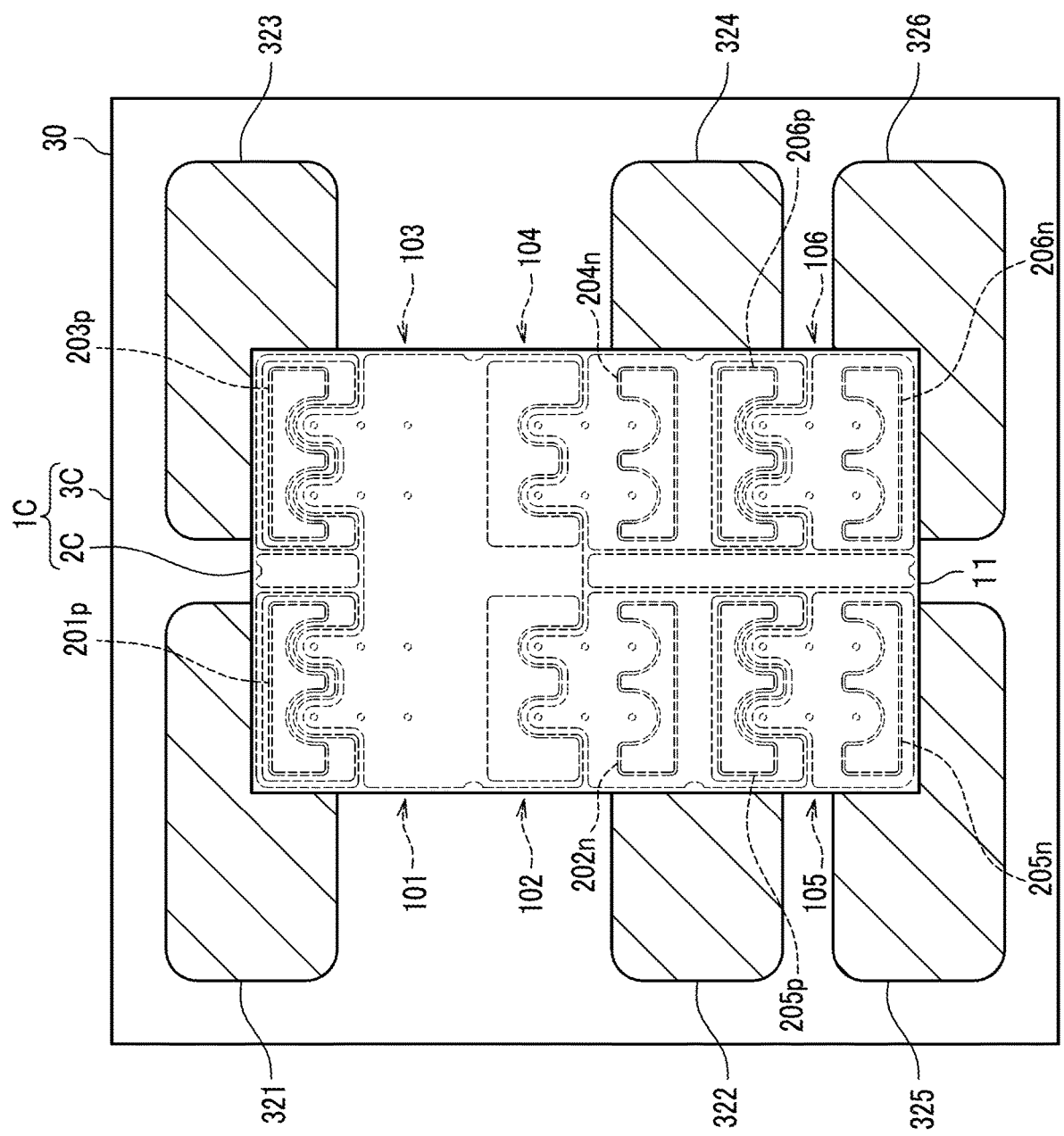
FIG. 12 is a schematic plan view of a light emitting device according to a third embodiment.
Figure 13:
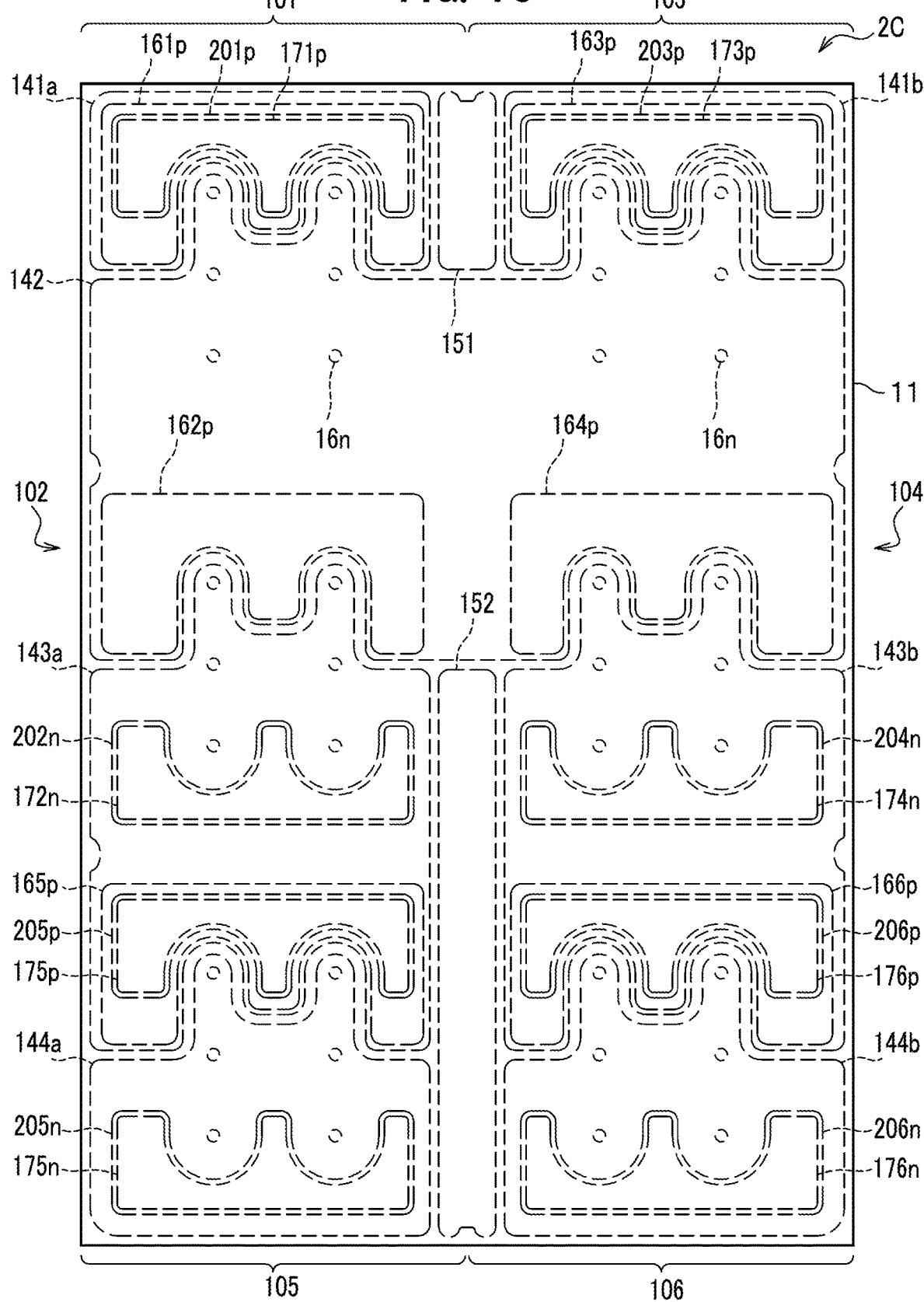
FIG. 13 is a schematic plan view of a light emitting element according to the third embodiment showing a surface of the light emitting element at a substrate side.
Figure 14:
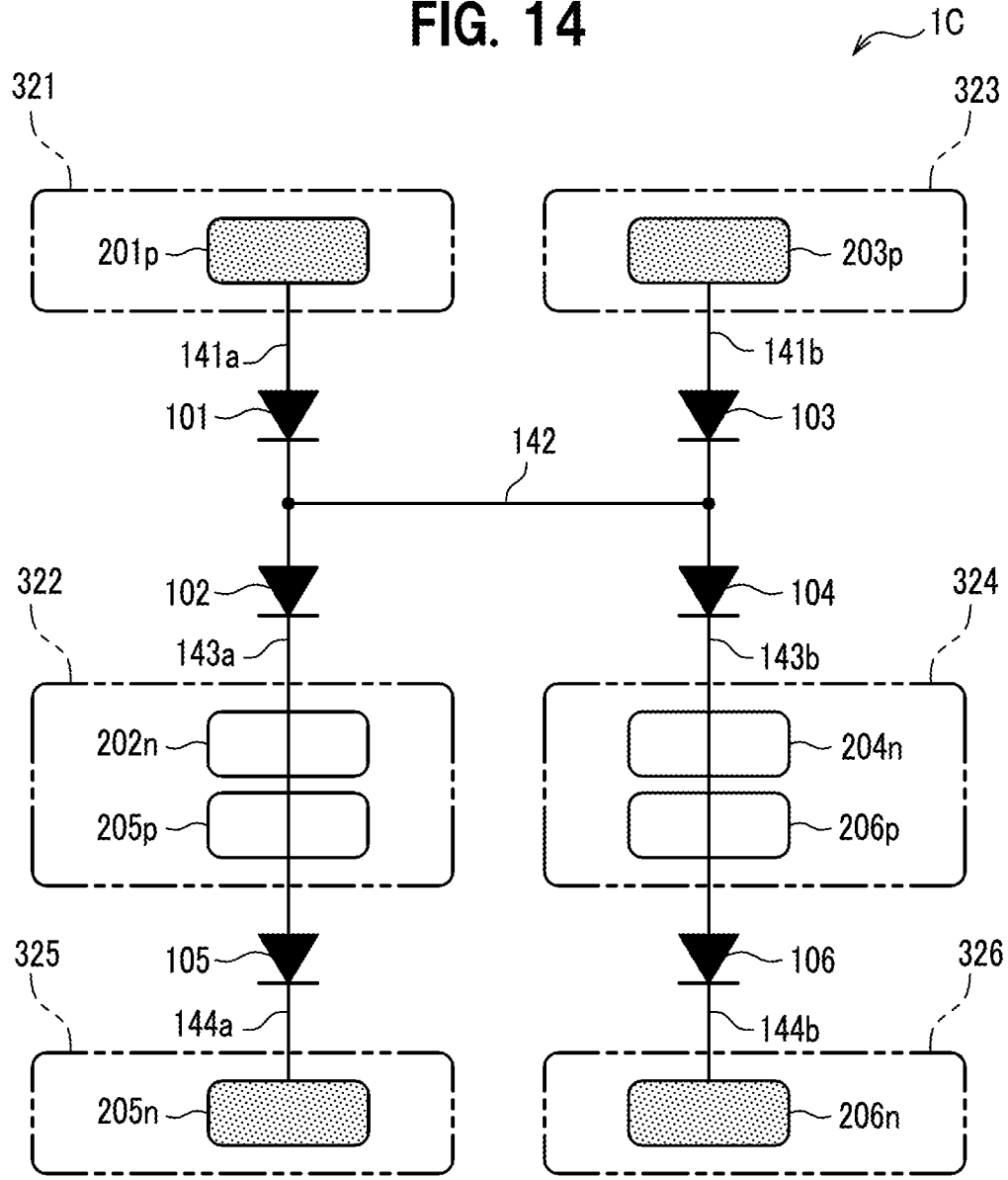
FIG. 14 is a circuit diagram illustrating an equivalent circuit of the light emitting element according to the third embodiment.

A light emitting device according to a third embodiment will be described with reference to FIG. 12 to FIG. 14. In FIG. 12 to FIG. 14, the same reference numerals will be applied to the components which have the same or similar structure as those shown in the first and second embodiments, and descriptions thereof will be appropriately omitted. Further, connections between respective components in a cross-sectional direction can be referred in the cross-sectional views in FIGS. 4 and 7 and a layered structure of the light emitting element shown in FIGS. 8A to 8G. Hereinafter, positional relationships between respective components in a plan view will be described.

The light emitting device 1C according to the third embodiment includes a light emitting element 2C, and a mounting substrate 3C. As in the light emitting element 2 shown in FIG. 7, the light emitting element 2C includes a substrate 11, semiconductor layered structure 12, light-reflective electrodes 13, a first insulating layer 16, and a second insulating layer 17. In FIG. 13, a substrate-side surface of the light emitting element 2C is shown, and illustration of some components are omitted for ease of explanation.

The light emitting element 2C includes first to sixth light emitting cells 101 to 106. As shown in FIG. 13, the light emitting element 2C includes a plurality of wiring electrodes 141a, 141b, 142, 143a, 143b, 144a, and 144b (which, in the third embodiment, may respectively corresponding to a first to a seventh wiring electrodes).

As in the cross-sectional view in FIG. 7, the first insulating layer 16 covers an upper side of each of the first to sixth light emitting cells 101 to 106, and defines, at an upper side of each of the light emitting cells 101 to 106, a plurality of first n-side openings 16n and a respective one of first p-side openings 161p, 162p, 163p, 164p, 165p, and 166p.

The first wiring electrode 141a is electrically connected to a p-side semiconductor layer 12p of the first light emitting cell 101 via the first p-side opening 161 defined above the first light emitting cell 101.

The second wiring electrode 141b is electrically connected to the p-side semiconductor layer 12p of the third light emitting cell 103 via the first p-side opening 163p defined above the third light emitting cell 103.

The third wiring electrode 142 is electrically connected to an n-side semiconductor layer 12n of the first light emitting cell 101 via the first n-side openings 16n defined above the first light emitting cell 101. Further, the third wiring electrode 142 is electrically connected to the p-side semiconductor layer 12p of the second light emitting cell 102 via the first p-side opening 162p defined above the second light emitting cell 102. Even further, the third wiring electrode 142 is electrically connected to the n-side semiconductor layer 12n of the third light emitting cell 103 via the first n-side openings 16n defined above the third light emitting cell 103. Still further, the third wiring electrode 142 is electrically connected to the p-side semiconductor layer 12p of the fourth light emitting cell 104 via the first p-side opening 164p defined above f the fourth light emitting cell 104. That is, the third wiring electrode 142 is electrically connected to the light emitting cells 101 to 104.

The fourth wiring electrode 143a is electrically connected to the n-side semiconductor layer 12n of the second light emitting cell 102 via the first n-side openings 16n defined above the second light emitting cell 102. Further, the fourth wiring electrode 143a is electrically connected to the p-side semiconductor layer 12p of the fifth light emitting cell 105 via the first p-side opening 165p defined above the second light emitting cell 105.

The fifth wiring electrode 143b is electrically connected to the n-side semiconductor layer 12n of the fourth light emitting cell 104 via the first n-side openings 16n defined above the fourth light emitting cell 104. Further, the fifth wiring electrode 143b is electrically connected to the p-side semiconductor layer 12p of the sixth light emitting cell 106 via the first p-side opening 166p defined above the sixth light emitting cell 106.

The sixth wiring electrode 144a is electrically connected to the n-side semiconductor layer 12n of the fifth light emitting cell 105 via the first n-side openings 16n defined above the fifth light emitting cell 105.

The seventh wiring electrode 144b is electrically connected to the n-side semiconductor layer 12n of the sixth light emitting cell 106 via the first n-side openings 16n defined above the sixth light emitting cell 106.

As shown in FIG. 13, the light-reflective metal layers 151 and 152 are disposed on at an upper surface side of the first insulating layer 16 in a region where the wiring electrodes (first electrode to seventh electrode) 141a, 141b, 142, 143a, 143b, 144a, and 44b are not disposed.

As in the cross-sectional view shown in FIG. 7, the second insulating layer 17 defines second p-side openings and second n-side openings. More specifically, the second insulating layer 17 defines a second p-side opening 171p at the upper side of the first light emitting cell 101, a second n-side opening 172n at the upper side of the second light emitting cell 102, a second p-side opening 173p at the upper side of the third light emitting cell 103, and a second n-side opening 174n at the upper side of the fourth light emitting cell 104. Further, the second insulating layer 17 defines a second p-side opening 175p and a second n-side opening 175n at the upper side of the fifth light emitting cell 105, and a second p-side opening 176p and a second n-side opening 176n at the upper side of the sixth light emitting cell 106.

As shown in FIG. 12, the mounting substrate 3C includes a base member 30 and a plurality of wiring terminals 321 to 326, and the plurality of wiring terminals 321 to 326 are disposed at positions corresponding to positions on which the bonding members of the light emitting element 2C, which is to be mounted, are to be arranged.

As shown in FIGS. 12, 13, and 14, three wiring terminals 321, 322, 325 (i.e., first wiring terminal 321, third wiring terminal 322, and fifth wiring terminal 325) are connected to the first light emitting cell 101, the second light emitting cell 102, the fifth light emitting cell 105, respectively.

The first wiring terminal 321 is electrically connected to the p-side semiconductor layer 12p of the first light emitting cell 101 via the first bonding member 201p in the second p-side opening 171p that corresponds to the first light emitting cell 101.

The third wiring terminal 322 is electrically connected to the n-side semiconductor layer 12n of the second light emitting cell 102 via the third bonding member 202n in the second n-side opening 172n that corresponds to the second light emitting cell 102. Further, the third wiring terminal 322 is electrically connected to the p-side semiconductor layer 12p of the fifth light emitting cell 105 via the fourth bonding member 205p in the second p-side opening 175p that corresponds to the fifth light emitting cell 105.

The fifth wiring terminal 325 is electrically connected to the seventh wiring electrode 144a via the sixth bonding member 205n. The sixth wiring electrode 144a is electrically connected to the n-side semiconductor layer 12n of the fifth light emitting cell 105 via the first n-side openings 16n formed at an upper side of the fifth light emitting cell 105.

As shown in FIGS. 12, 13, and 14, three wiring terminals 323, 324, 326 (i.e., first wiring terminal 321, third wiring terminal 322, and fifth wiring terminal 325) are connected to the third light emitting cell 103, the fourth light emitting cell 104, and the sixth light emitting cell 106, respectively.

The second wiring terminal 323 is electrically connected to the p-side semiconductor layer 12p of the third light emitting cell 103 via the second bonding member 203p in the second p-side opening 173p that corresponds to the third light emitting cell 103.

The fourth wiring terminal 324 is electrically connected to the n-side semiconductor layer 12n of the fourth light emitting cell 104 via the fourth bonding member 204n in the second n-side opening 174n that corresponds to the fourth light emitting cell 104. Further, the fourth wiring terminal 324 is electrically connected to the p-side semiconductor layer 12p of the second light emitting cell 106 via the sixth bonding member 206p in the second p-side opening 176p that corresponds to the sixth light emitting cell 106.

The sixth wiring terminal 326 is electrically connected to the eighth wiring electrode 144b via the seventh bonding member 206n. The seventh wiring electrode 144b is electrically connected to the n-side semiconductor layer 12n of the sixth light emitting cell 106 via the first n-side openings 16n formed at an upper side of the sixth light emitting cell 106.

In the mounting substrate 3C, as a plurality of wiring terminals for a power source, for example, the first and second wiring terminals 321 and 323 are used for positive electrodes, and the fifth and sixth wiring terminals 325 and 326 are used for negative electrodes. In this case, the first wiring terminal 321 is electrically connected to the first bonding member 201p that serves as a positive electrode of the light emitting element 2C, and the fifth wiring terminal 325 is electrically connected to the fifth bonding member 205n that serves as a negative electrode of the light emitting element 2C. Further, the second wiring terminal 323 is electrically connected to the second bonding member 203p that serves as a positive electrode of the light emitting element 2C, and the sixth wiring terminal 326 is electrically connected to the sixth bonding member 206n that serves as a negative electrode of the light emitting element 2C. The first, second, and fifth light emitting cells 101, 102, and 105 are configured to emit light when the external power source supplies electric power to the light emitting element 2C via the first and fifth wiring electrodes 321 and 325. Further, the third, fourth, and sixth light emitting cells 103, 104, and 106 are configured to emit light when the external power source supplies electric power to the light emitting element 2C via the second and sixth wiring electrodes 323 and 326.

Electric power may be supplied simultaneously to the first and fifth wiring electrodes 321 and 325 and the second and sixth wiring terminals 323 and 326.

The light emitting device according to the third embodiment has an effect similar to that in the first embodiment. In the case in which a plurality of light emitting cells are connected between the wiring terminals as in the second embodiment, when the inspection is performed in which voltage is applied between the wiring terminals, leakage is failed to be detected unless leakage occurs in all of the light emitting cells connected between the wiring terminals. For example, in the case in which two light emitting cells are connected between the wiring terminals and either one of the light emitting cells is normal, leakage that occurs in the other of the light emitting cells is failed to be detected. However, according to the present embodiment, even in the case in which a plurality of light emitting cells are connected between the wiring terminals, occurrence of leakage can be detected, and a light emitting cell where leakage occurs can be specified among the plurality of light emitting cells. Hereinafter, a method of inspecting light emitting cells in the light emitting device according to the third embodiment will be described with reference to FIG. 15A and FIG. 15B.

Occurrence of leakage in the light emitting cells of the light emitting device according to the third embodiment can be inspected by using a method as below. The method of inspecting the light emitting device includes a first measuring, a second measuring, and determining. In the step of first measuring, voltage is applied between wiring terminals, and a current value through the plurality of light emitting cells connected between the wiring terminals is measured. In the step of second measuring, voltage is applied between the wiring terminals that is the same as in the step of first measuring, and a current value through the plurality of light emitting cells connected between the wiring terminals is measured.

In the step of determining, of the light emitting cells connected between the wiring terminals, the light emitting cell in which leakage is occurred is determined with reference to the current value measured in the step of first measuring and the step of second measuring.

A method of inspecting the light emitting device according to the third embodiment will be more specifically described with reference to FIG. 15A and FIG. 15B.

As shown in FIG. 15A, in the step of first measuring, a power source and a current meter for applying voltage and measuring current, respectively, are connected between the wiring terminals 321 and 323. In this state, by applying voltage, current flows through the wiring terminals 321 and 323 and the wiring electrodes 141a, 142, and 141b. Then, a current value through the light emitting cells 101 and 103, which are connected between the wiring terminal 321 and the wiring terminal 323, is measured. If a predetermined current value is measured, occurrence of leakage in any one of the light emitting cells 101 and 103 can be confirmed. If the predetermined current value is not measured, it is confirmed that a leak current does not flow, that is, leakage does not occur in the light emitting cell 103.

Figure 15B:
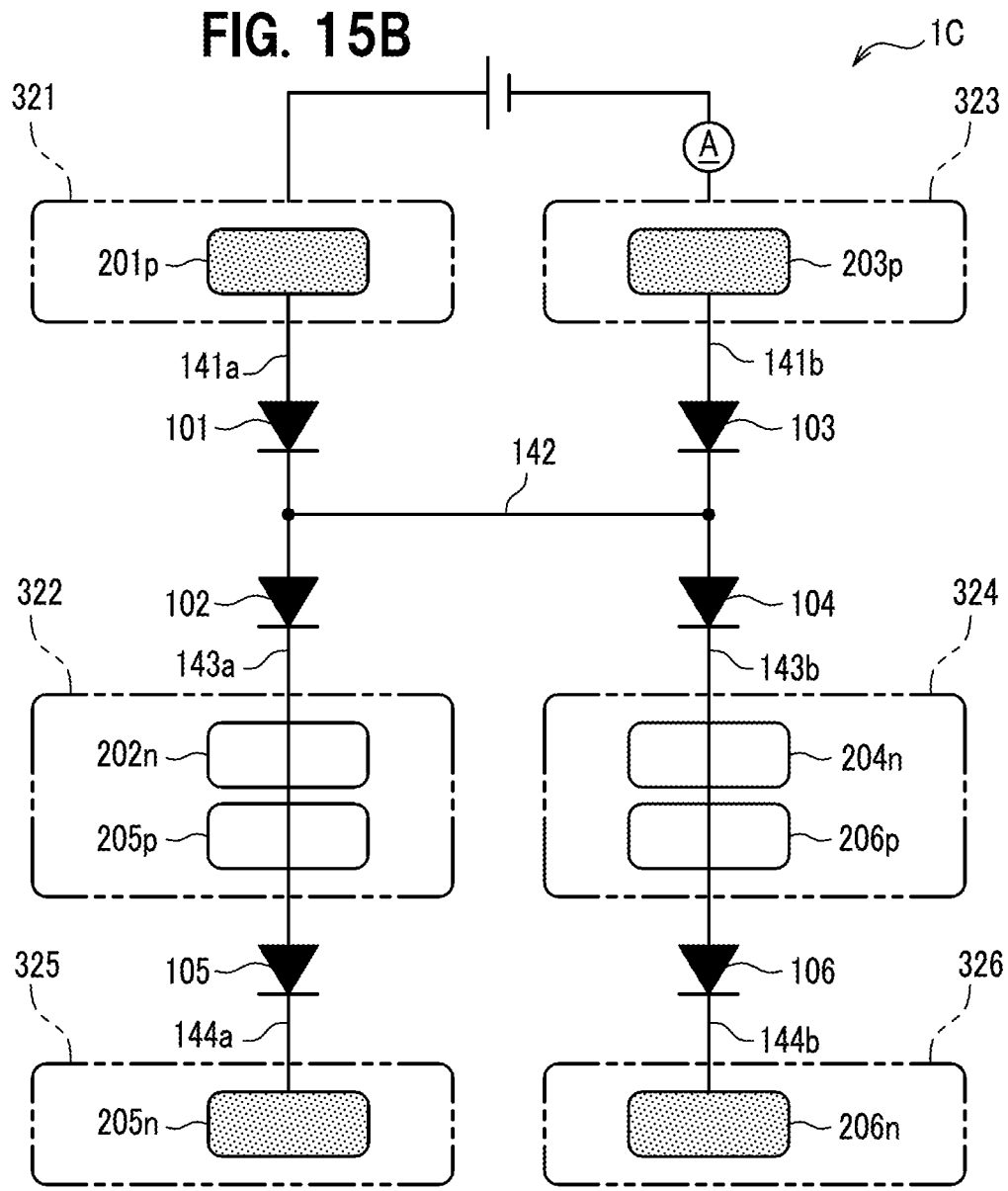
FIG. 15B is a circuit diagram for illustrating a second measuring step in the method of inspecting the light emitting device according to the third embodiment.

As shown in FIG. 15B, in the step of second measuring, voltage is applied in a direction reverse to that in the first measuring, and a current value through the plurality of light emitting cells 101 and 103, which are connected between the wiring terminals 321 and 323, is measured. At this time, if a predetermined current value is measured, occurrence of leakage in any one of the light emitting cells 101 and 103 can be confirmed. If the predetermined current value is not measured, it is confirmed that a leak current does not flow, that is, leakage does not occur in the light emitting cell 103.

In the step of determining, the light emitting cell in which leakage is occurred is determined with reference to the result of the first measuring and the result of the second measuring. For example, if a predetermined current value is measured in the step of first measuring and the predetermined current value is not measured in the step of second measuring, it is determined that leakage occurs in the light emitting cell 101 and does not occur in the light emitting cell 103.

Further, by applying voltage between the wiring terminal 322 and the wiring terminal 324 and performing the step of inspecting as described above in a similar manner, of the light emitting cells 102 and 104, the light emitting cell in which leakage occurs can be determined.

Next, with reference to FIGS. 16A, 16B, and 16C, certain variant examples of the third embodiment will be described.

Variant Example of Third Embodiment

Figure 16A:
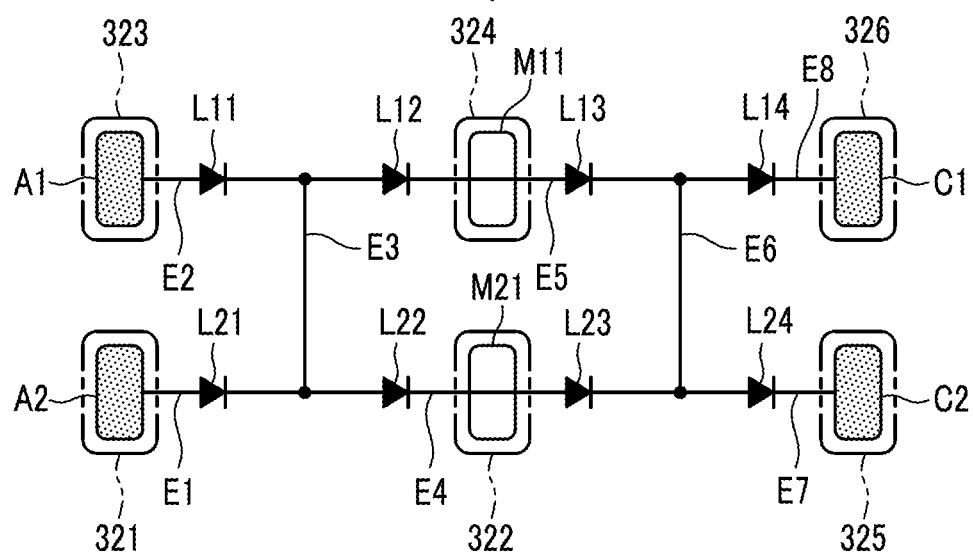
FIG. 16A is a circuit diagram illustrating an equivalent circuit of the light emitting element according to a first variant example of the third embodiment.
Figure 16B:
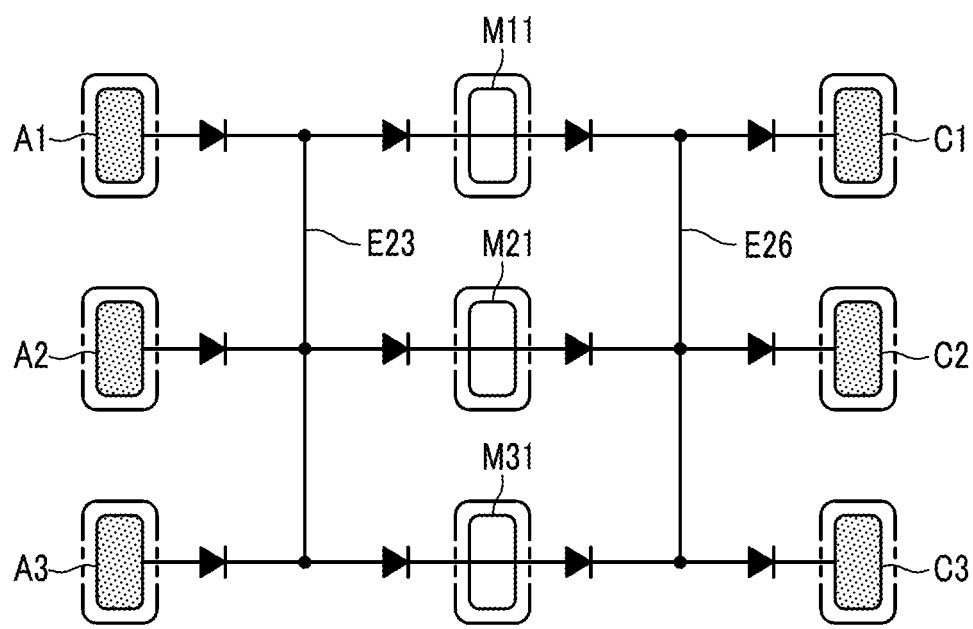
FIG. 16B is a circuit diagram illustrating an equivalent circuit of the light emitting element according to another variant example of the third embodiment.

As shown in an equivalent circuit shown in FIG. 16A, in a light emitting device according to a variant example of the third embodiment, eight light emitting cells L11, L12, L13, L14, L21, L22, L23, and L24 are connected to six wiring terminals 321, 322, 323, 324, 325, and 326 and a plurality of wiring electrodes E1 to E8. The variant example of the third embodiment is different from the third embodiment in that two wiring electrodes, each of which is as in the wiring electrode 142 in the third embodiment, that integrally connect four light emitting cells are disposed. More specifically, a wiring electrode E3, which is connected to four light emitting cells L11, L12, L21 and L22, and a wiring electrode E6, which is electrically connected to four light emitting cells L13, L14, L23, and L24, are disposed. In a first variant example of the third embodiment, the inspection as described above is performed between respective wiring terminals, so that occurrence of leakage in the light emitting cells L11, L14, L21, and L24 can be specified.

In the description above, the eight light emitting cells, the six bonding members A1, A2, C1, C2, M11, and M21, and the wiring terminal 321 to 326 are disposed, but any number of the light emitting cells, the bonding members, and the wiring terminals may be employed. For example, as in an equivalent circuit shown in FIG. 16B, two wiring electrodes E2 and E26, each of which connects its corresponding six light emitting cells arranged in three rows and two columns, and wiring terminals, each of which corresponds to a respective one of the bonding members A1 to A3, C1 to C3, M11, M21, and M31, may be disposed. Even further, as in an equivalent circuit shown in FIG. 16C, two wiring electrodes E33 and E36, each of which connects its corresponding eight light emitting cells arranged in four rows and two columns, and wiring terminals, may be disposed, and some of the bonding members may be integrally formed.

Figure 16C:
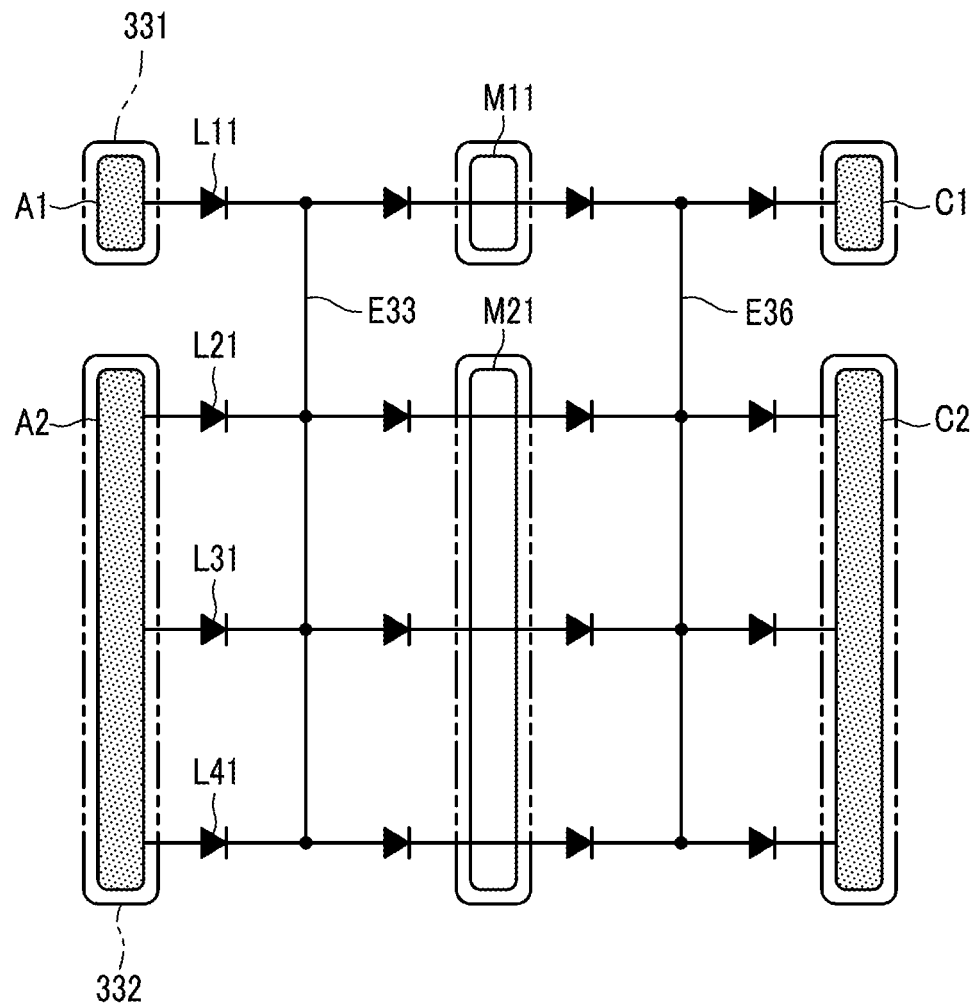
FIG. 16C is a circuit diagram illustrating an equivalent circuit of the light emitting element according to even another variant example of the third embodiment.

That is, as in the equivalent circuit shown in FIG. 16C, instead of disposing bonding members each corresponding to a respective one of the light emitting cells, for example, a single bonding member A1 and a single wiring terminal 331 may be disposed with respect to a single light emitting cell L11, and a single bonding member A2 and a single wiring terminal 332 may be disposed with respect to three light emitting cells L21, L31, and L41.

As shown in the above, a light emitting device according to the present disclosure is illustrated in accordance with certain embodiments for carrying out the present invention, but the scope of the invention is not limited to the above description, and should be widely understood based on the scope of claims. Further, based on the above description, it will be obvious that various changes and modifications can be made therein without departing from the scope of the invention.

The light emitting device according to certain embodiments of the present invention is applicable for various light sources such as a backlight light source of a liquid crystal display, various illumination devices, and a large-screen display.

What is claimed is:
1. A light emitting device comprising:
a light emitting element comprising:
   a substrate,
   a first light emitting cell and a second light emitting cell, each comprising a semiconductor layered structure that comprises an n-side semiconductor layer and a p-side semiconductor layer in order from a substrate side,
   a first insulating layer covering an upper side of each of the first light emitting cell and the second light emitting cell and defining first n-side openings and a first p-side opening above each of the first and second light emitting cells,
   a plurality of wiring electrodes covering an upper side of the first insulating layer and comprising:
      a first wiring electrode electrically connected to the p-side semiconductor layer of the first light emitting cell via the first p-side opening above the first light emitting cell,
      a second wiring electrode electrically connected to the n-side semiconductor layer of the first light emitting cell via the first n-side openings above the first light emitting cell and electrically connected to the p-side semiconductor layer of the second light emitting cell via the first p-side opening above the second light emitting cell, and
      a third wiring electrode electrically connected to the n-side semiconductor layer of the second light emitting cell via the first n-side openings above the second light emitting cell,
   a second insulating layer covering an upper side of the plurality of wiring electrodes and defining second n-side openings and a second p-side opening above each of the first and second light emitting cells, wherein an entirety of each of the second n-side openings is located directly above the p-side semiconductor layer of the corresponding light emitting cell, and an entirety of each of the second p-side openings is located directly above the p-side semiconductor layer of the corresponding light emitting cell,
   a first bonding member disposed at the second p-side opening of the first light emitting cell,
   a second bonding member disposed at the second n-side opening of the first light emitting cell,
   a third bonding member disposed at the second p-side opening of the second light emitting cell, and
   a fourth bonding member disposed at the second n-side opening of the second light emitting cell; and
a mounting substrate on which the light emitting element is mounted such that the mounting substrate faces an upper side of the light emitting element, the mounting substrate comprising:
   a first wiring terminal electrically connected to the p-side semiconductor layer of the first light emitting cell via the first bonding member at the second p-side opening corresponding to the first light emitting cell,
   a second wiring terminal electrically connected to the n-side semiconductor layer of the first light emitting cell via the second bonding member at the second n-side opening corresponding to the first light emitting cell and electrically connected to the p-side semiconductor layer of the second light emitting cell via the third bonding member at the second p-side opening corresponding to the second light emitting cell, and a third wiring terminal electrically connected to the n-side semiconductor layer of the second light emitting cell via the fourth bonding member at the second n-side opening corresponding to the second light emitting cell.

2. The light emitting device according to claim 1, wherein an entirety of each of the first to fourth bonding members is disposed inward of a periphery of a corresponding one of the first and second light emitting cells when viewed from above.

3. The light emitting device according to claim 2, wherein each of the first to third wiring electrodes cover lateral surfaces of the first and second light emitting cells and regions between the first and second light emitting cells via the first insulating layer.

4. The light emitting device according to claim 2, wherein each of the first to third wiring electrodes is made of Al or an Al alloy.

5. The light emitting device according to claim 2, wherein light emitted from the semiconductor layered structure is extracted from a surface of the n-side semiconductor layer opposite to a surface above which the p-side semiconductor layer is disposed.

6. The light emitting device according to claim 1, wherein each of the first to third wiring electrodes cover lateral surfaces of the first and second light emitting cells and regions between the first and second light emitting cells via the first insulating layer.

7. The light emitting device according to claim 6, wherein each of the first to third wiring electrodes is made of Al or an Al alloy.

8. The light emitting device according to claim 6, wherein light emitted from the semiconductor layered structure is extracted from a surface of the n-side semiconductor layer opposite to a surface above which the p-side semiconductor layer is disposed.

9. The light emitting device according to claim 1, wherein each of the first to third wiring electrodes is made of Al or an Al alloy.

10. The light emitting device according to claim 1, wherein light emitted from the semiconductor layered structure is extracted from a surface of the n-side semiconductor layer opposite to a surface above which the p-side semiconductor layer is disposed.

11. The light emitting device according to claim 1, wherein the second wiring terminal extends continuously in a lateral direction from the second bonding member at the second n-side opening corresponding to the first light emitting cell to the third bonding member at the second p-side opening corresponding to the second light emitting cell.

12. A light emitting device comprising:
a light emitting element comprising:
a substrate,
a first light emitting cell, a second light emitting cell, a third light emitting cell, a fourth light emitting cell, a fifth light emitting cell, and a sixth light emitting cell, each comprising a semiconductor layered structure that comprises an n-side semiconductor layer and a p-side semiconductor layer in order from a substrate side,
a first insulating layer covering an upper side of each of the first to sixth light emitting cells and defining first n-side openings and a first p-side opening above each of the first to sixth light emitting cells,
a plurality of wiring electrodes covering an upper side of the first insulating layer and comprising:
a first wiring electrode electrically connected to the p-side semiconductor layer of the first light emitting cell via the first p-side opening above the first light emitting cell,
a second wiring electrode electrically connected to the p-side semiconductor layer of the third light emitting cell via the first p-side opening above the third light emitting cell,
a third wiring electrode electrically connected to the n-side semiconductor layer of the first light emitting cell via the first n-side openings above the first light emitting cell, electrically connected to the p-side semiconductor layer of the second light emitting cell via the first p-side opening above the second light emitting cell, electrically connected to the n-side semiconductor layer of the third light emitting cell via the first n-side openings above the third light emitting cell, and electrically connected to the p-side semiconductor layer of the fourth light emitting cell via the first p-side opening above the fourth light emitting cell,
a fourth wiring electrode electrically connected to the n-side semiconductor layer of the second light emitting cell via the first n-side openings above the second light emitting cell and electrically connected to the p-side semiconductor layer of the fifth light emitting cell via the first p-side opening above the fifth light emitting cell,
a fifth wiring electrode electrically connected to the n-side semiconductor layer of the fourth light emitting cell via the first n-side openings above the fourth light emitting cell and electrically connected to the p-side semiconductor layer of the sixth light emitting cell via the first p-side opening above the sixth light emitting cell,
a sixth wiring electrode electrically connected to the n-side semiconductor layer of the fifth light emitting cell via the first n-side openings above the fifth light emitting cell, and
a seventh wiring electrode electrically connected to the n-side semiconductor layer of the sixth light emitting cell via the first n-side openings above the sixth light emitting cell,
a second insulating layer covering an upper side of the plurality of wiring electrodes and defining second n-side openings and a second p-side opening above each of the first, third, fifth, and sixth light emitting cells, wherein an entirety of each of the second n-side openings is located directly above the p-side semiconductor layer of the corresponding light emitting cell, and an entirety of each of the second p-side openings is located directly above the p-side semiconductor layer of the corresponding light emitting cell,
a first bonding member disposed at the second p-side opening of the first light emitting cell,
a second bonding member disposed at the second p-side opening of the third light emitting cell,
a third bonding member disposed at the second n-side opening of the second light emitting cell,
a fourth bonding member disposed at the second p-side opening of the fifth light emitting cell,
a fifth bonding member disposed at the second n-side opening of the fourth light emitting cell, and
a sixth bonding member disposed at the second n-side opening of the sixth light emitting cell; and a mounting substrate on which the light emitting element is mounted such that the mounting substrate faces an upper side of the light emitting element, the mounting substrate comprising:
- a first wiring terminal electrically connected to the p-side semiconductor layer of the first light emitting cell via the first bonding member at the second p-side opening corresponding to the first light emitting cell,
- a second wiring terminal electrically connected to the p-side semiconductor layer of the third light emitting cell via the second bonding member at the second p-side opening corresponding to the third light emitting cell,
- a third wiring terminal electrically connected to the n-side semiconductor layer of the second light emitting cell via the third bonding member at the second n-side opening corresponding to the second light emitting cell and electrically connected to the p-side semiconductor layer of the fifth light emitting cell via the fourth bonding member at the second p-side opening corresponding to the fifth light emitting cell,
- a fourth wiring terminal electrically connected to the n-side semiconductor layer of the fourth light emitting cell via the fifth bonding member at the second n-side opening corresponding to the fourth light emitting cell and electrically connected to the p-side semiconductor layer of the sixth light emitting cell via the sixth bonding member at the second p-side opening corresponding to the sixth light emitting cell,
- a fifth wiring terminal electrically connected to the sixth wiring electrode that is electrically connected to the n-side semiconductor layer of the fifth light emitting cell via the first n-side openings above the fifth light emitting cell, and
- a sixth wiring terminal electrically connected to the seventh wiring electrode that is electrically connected to the n-side semiconductor layer of the sixth light emitting cell via the first n-side openings above the sixth light emitting cell.

13. The light emitting device according to claim 12, wherein an entirety of each of the first to sixth bonding members is disposed at an inner side of a periphery of a corresponding one of the first to sixth light emitting cells when viewed from above.

14. The light emitting device according to claim 13, wherein each of the first to seventh wiring electrodes cover lateral surfaces of the first to sixth light emitting cells and regions between the first to sixth light emitting cells via the first insulating layer.

15. The light emitting device according to claim 13, wherein each of the first to seventh wiring electrodes is made of Al or an Al alloy.

16. The light emitting device according to claim 13, wherein light emitted from the semiconductor layered structure is extracted from a surface of the n-side semiconductor layer opposite to a surface above which the p-side semiconductor layer is disposed.

17. The light emitting device according to claim 12, wherein each of the first to seventh wiring electrodes cover lateral surfaces of the first to sixth light emitting cells and regions between the first to sixth light emitting cells via the first insulating layer.

18. The light emitting device according to claim 17, wherein each of the first to seventh wiring electrodes is made of Al or an Al alloy.

19. The light emitting device according to claim 17, wherein light emitted from the semiconductor layered structure is extracted from a surface of the n-side semiconductor layer opposite to a surface above which the p-side semiconductor layer is disposed.

20. The light emitting device according to claim 12, wherein each of the first to seventh wiring electrodes is made of Al or an Al alloy.

21. The light emitting device according to claim 12, wherein light emitted from the semiconductor layered structure is extracted from a surface of the n-side semiconductor layer opposite to a surface above which the p-side semiconductor layer is disposed.

22. The light emitting device according to claim 12, wherein:
- the third wiring terminal extends continuously in a lateral direction from the third bonding member at the second n-side opening corresponding to the second light emitting cell to the fourth bonding member at the second p-side opening corresponding to the fifth light emitting cell, and
- the fourth wiring terminal extends continuously in a lateral direction from the fifth bonding member at the second n-side opening corresponding to the fourth light emitting cell to the sixth bonding member at the second p-side opening corresponding to the sixth light emitting cell.

* * * * *